US010541103B2

(12) United States Patent
Mizuhara et al.

(10) Patent No.: US 10,541,103 B2
(45) Date of Patent: Jan. 21, 2020

(54) CHARGED PARTICLE BEAM DEVICE

(71) Applicant: Hitachi High-Technologies Corporation, Minato-ku, Tokyo (JP)

(72) Inventors: Yuzuru Mizuhara, Tokyo (JP);
Toshiyuki Yokosuka, Tokyo (JP);
Hideyuki Kazumi, Tokyo (JP);
Kouichi Kurosawa, Tokyo (JP);
Kenichi Myochin, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 118 days.

(21) Appl. No.: 15/533,517

(22) PCT Filed: Dec. 10, 2014

(86) PCT No.: PCT/JP2014/082611
§ 371 (c)(1),
(2) Date: Jun. 6, 2017

(87) PCT Pub. No.: WO2016/092642
PCT Pub. Date: Jun. 16, 2016

(65) Prior Publication Data
US 2017/0345613 A1    Nov. 30, 2017

(51) Int. Cl.
*H01J 37/12* (2006.01)
*H01J 37/244* (2006.01)
(Continued)

(52) U.S. Cl.
CPC ............. *H01J 37/12* (2013.01); *H01J 37/05* (2013.01); *H01J 37/244* (2013.01); *H01J 37/28* (2013.01);
(Continued)

(58) Field of Classification Search
CPC ........... H01J 37/12; H01J 37/05; H01J 37/244
(Continued)

(56) References Cited

U.S. PATENT DOCUMENTS 8,258,475 B2 * 9/2012 Hirose ................. H01J 37/153
250/306
8,648,300 B2 * 2/2014 Isawa ................ G01N 23/2258
250/306
(Continued)

FOREIGN PATENT DOCUMENTS

JP       2006-190653 A     7/2006
JP       2008-186689 A     8/2008
(Continued)

OTHER PUBLICATIONS

International Search Report (PCT/ISA/210) issued in PCT Application No. PCT/JP2014/082611 dated Feb. 10, 2015 with English-language translation (eight (8) pages).
(Continued)

*Primary Examiner* — Michael Maskell
(74) *Attorney, Agent, or Firm* — Crowell & Moring LLP

(57) ABSTRACT

The purpose of the present invention is to reduce the amount of charged particles that are lost by colliding with the interior of a column of a charged particle beam device, and detect charged particles with high efficiency. To achieve this purpose, proposed is a charged particle beam device provided with: an objective lens that focuses a charged particle beam; a detector that is disposed between the objective lens and a charged particle source; a deflector that deflects charged particles emitted from a sample such that the charged particles separate from the axis of the charged particle beam; and a plurality of electrodes that are disposed between the deflector and the objective lens and that form a plurality of electrostatic lenses for focusing the charged particles emitted from the sample on a deflection point of the deflector.

19 Claims, 19 Drawing Sheets

(51) Int. Cl.
*H01J 37/28* (2006.01)
*H01J 37/05* (2006.01)

(52) U.S. Cl.
CPC ... *H01J 2237/12* (2013.01); *H01J 2237/2448* (2013.01); *H01J 2237/24485* (2013.01)

(58) Field of Classification Search
USPC .................................. 250/306, 307, 310, 311
See application file for complete search history.

(56) References Cited

U.S. PATENT DOCUMENTS

| | | | |
|---|---|---|---|
| 8,759,761 B2 | 6/2014 | Doi | |
| 2002/0088940 A1* | 7/2002 | Watanabe | H01J 37/224 250/310 |
| 2005/0001165 A1* | 1/2005 | Parker | H01J 37/244 250/310 |
| 2006/0060780 A1* | 3/2006 | Masnaghetti | H01J 37/05 250/310 |
| 2006/0151711 A1 | 7/2006 | Frosien et al. | |
| 2008/0191135 A1 | 8/2008 | Aoki et al. | |
| 2008/0237465 A1 | 10/2008 | Hatano et al. | |
| 2014/0124666 A1 | 5/2014 | Sasaki et al. | |
| 2015/0348748 A1 | 12/2015 | Mizuhara et al. | |

FOREIGN PATENT DOCUMENTS

| | | |
|---|---|---|
| JP | 2008-243485 A | 10/2008 |
| JP | 2014-22040 A | 2/2014 |
| JP | 5478683 B2 | 4/2014 |
| JP | 2014-143035 A | 8/2014 |
| JP | 2014-146526 A | 8/2014 |
| WO | WO 2012/172720 A1 | 12/2012 |

OTHER PUBLICATIONS

Japanese-language Written Opinion (PCT/ISA/237) issued in PCT Application No. PCT/JP2014/082611 dated Feb. 10, 2015 (five (5) pages).

* cited by examiner

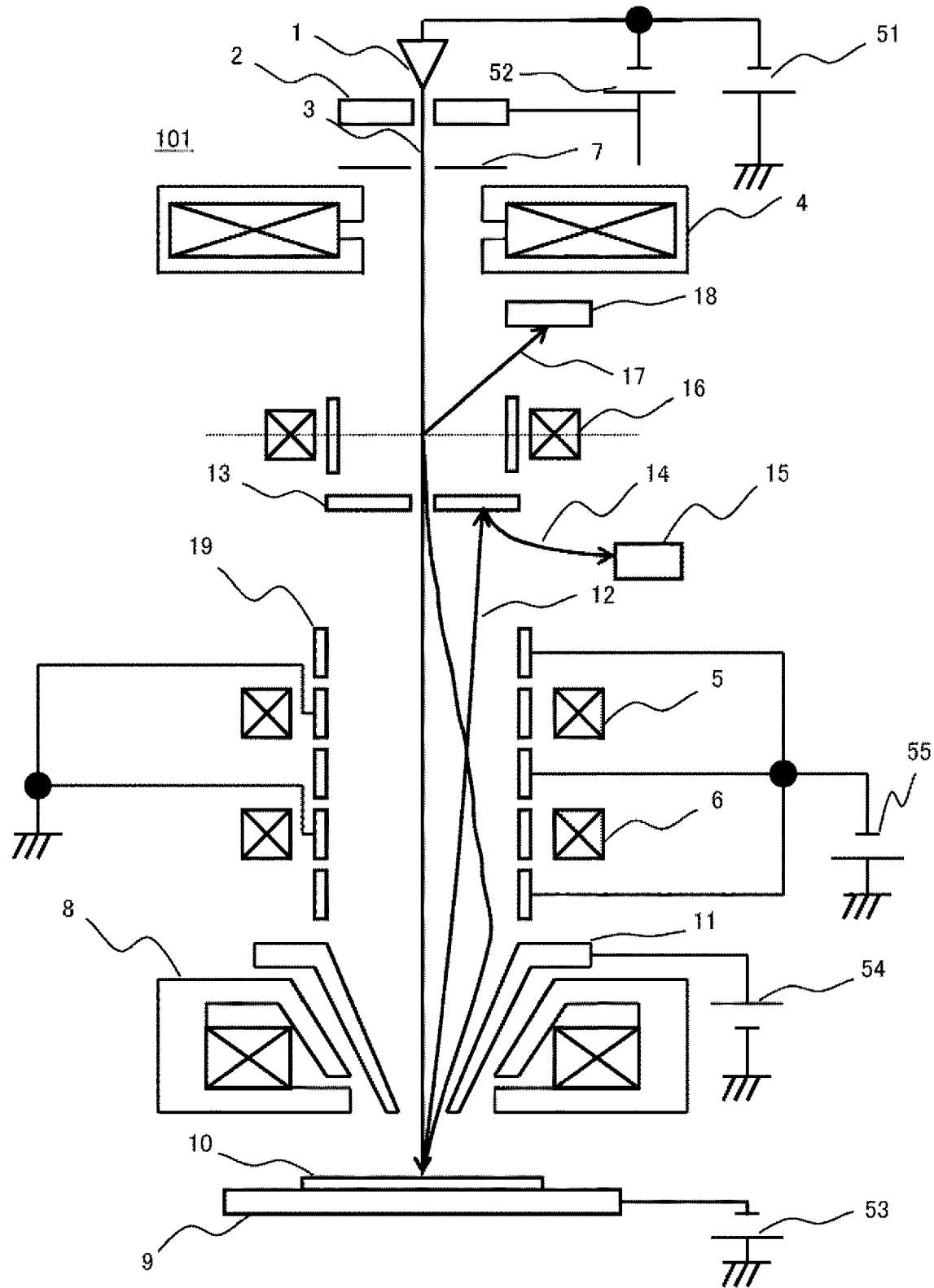
[Fig. 1]

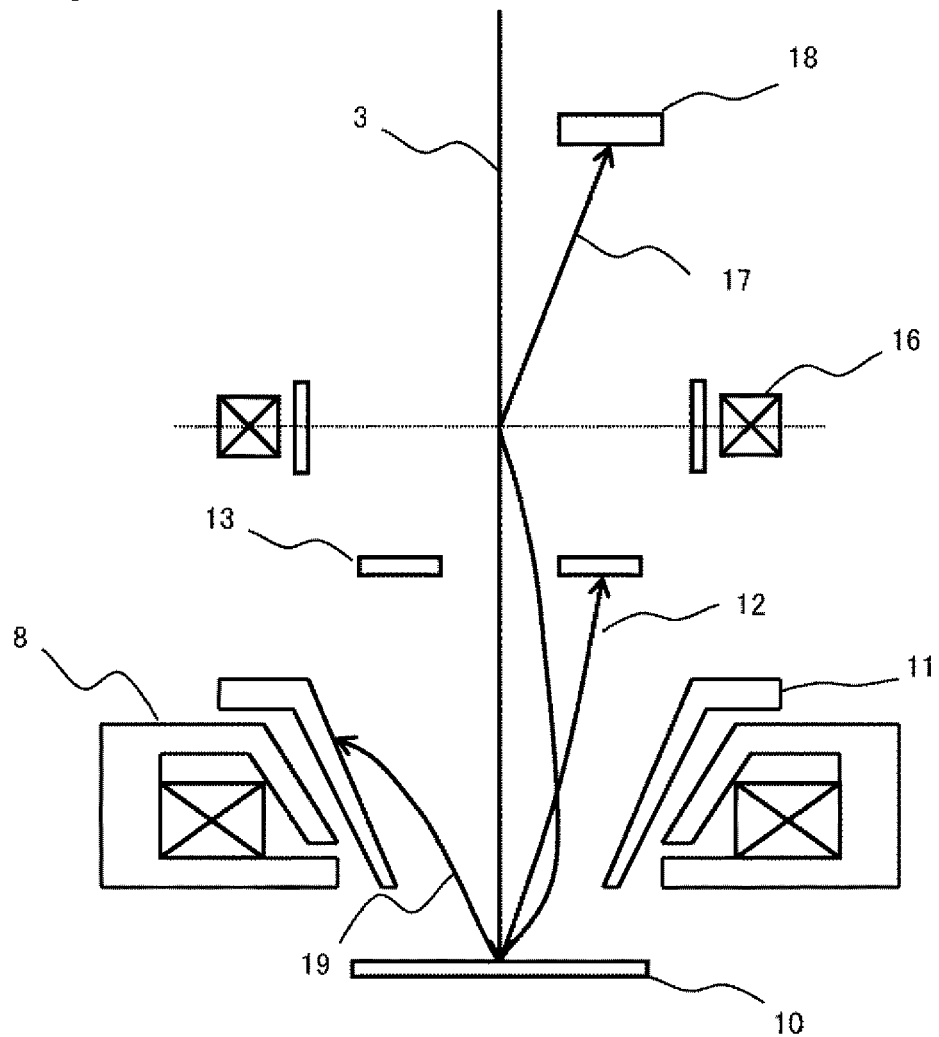
[Fig. 2]

[Fig. 3]
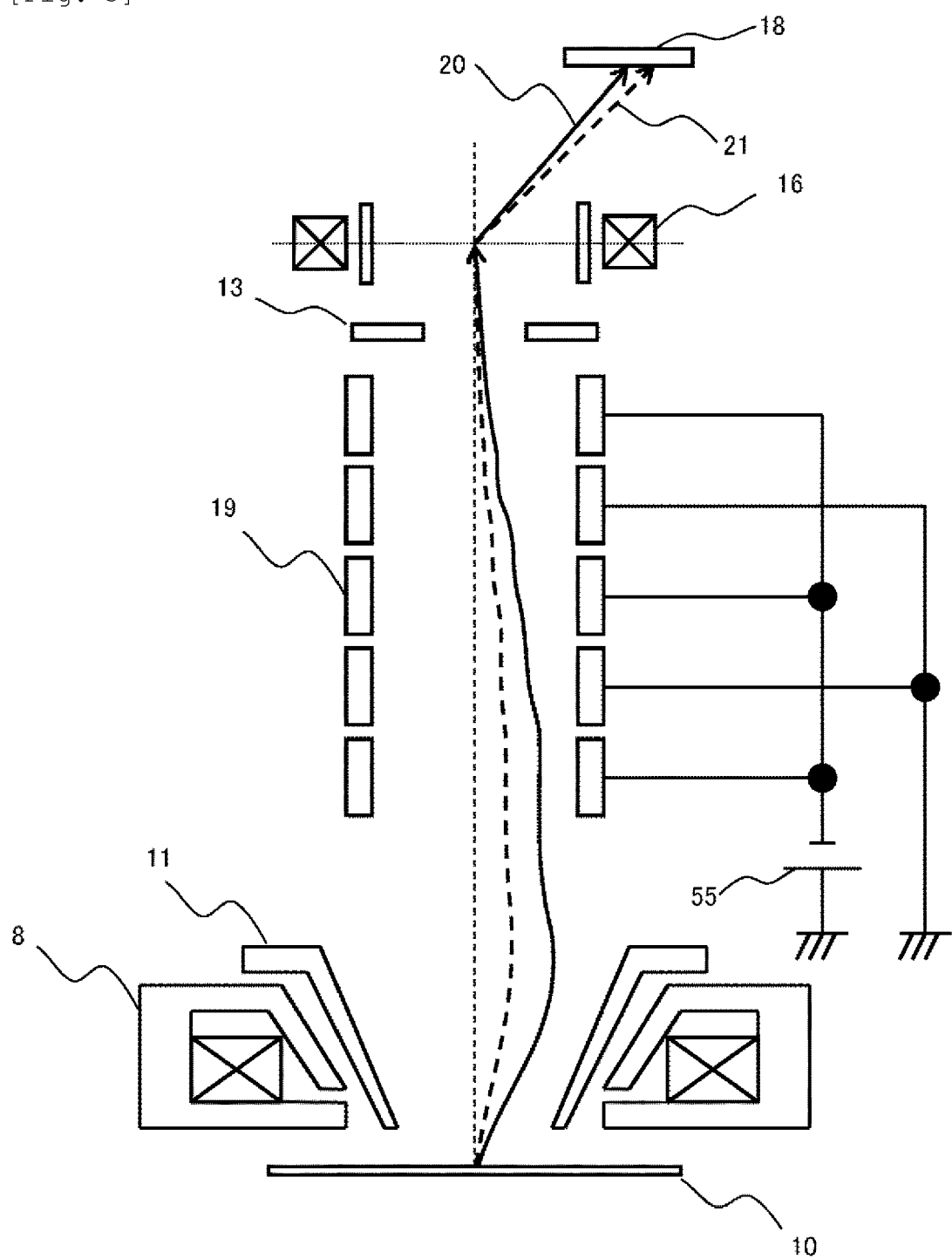

[Fig. 4]
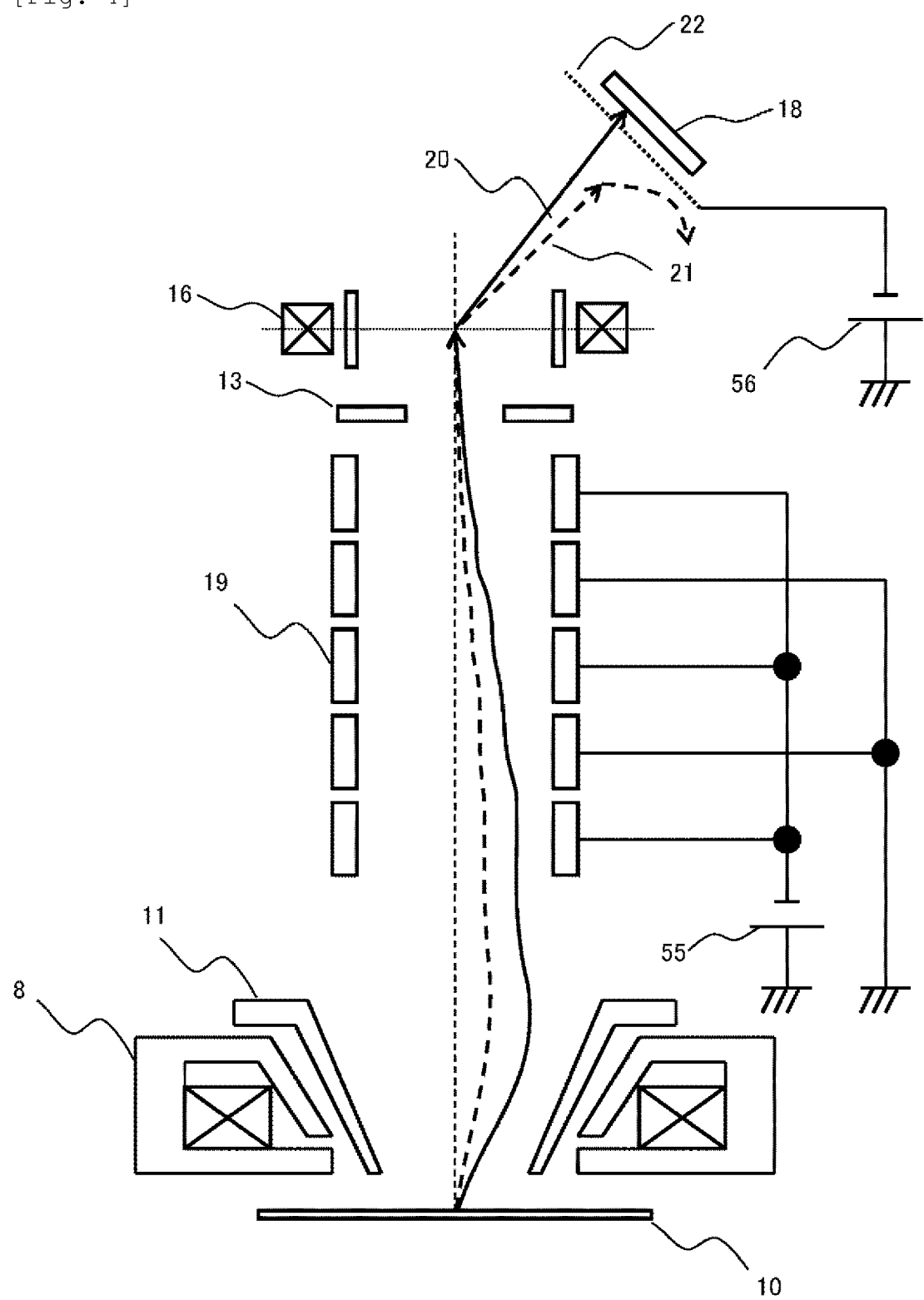

[Fig. 5]
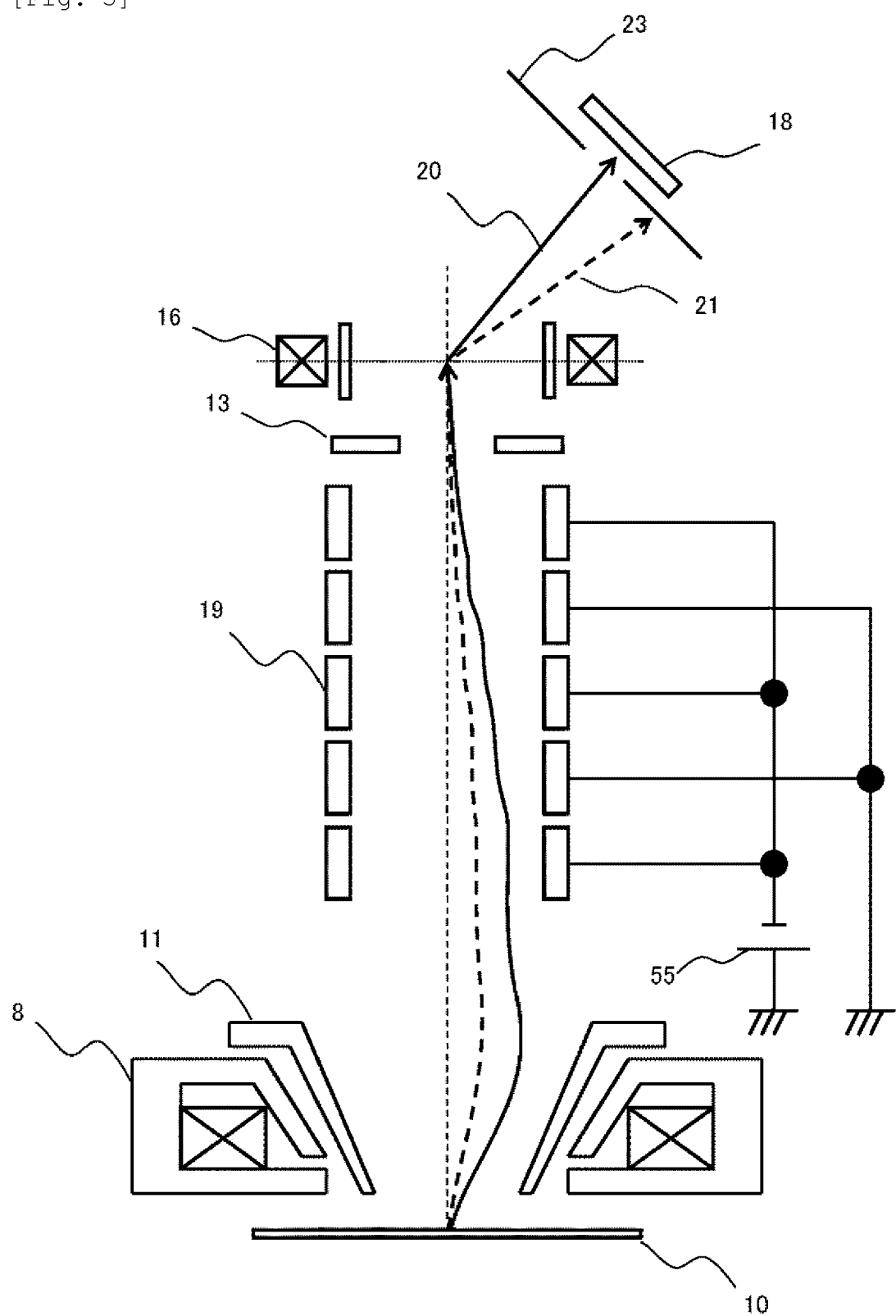

[Fig. 6]
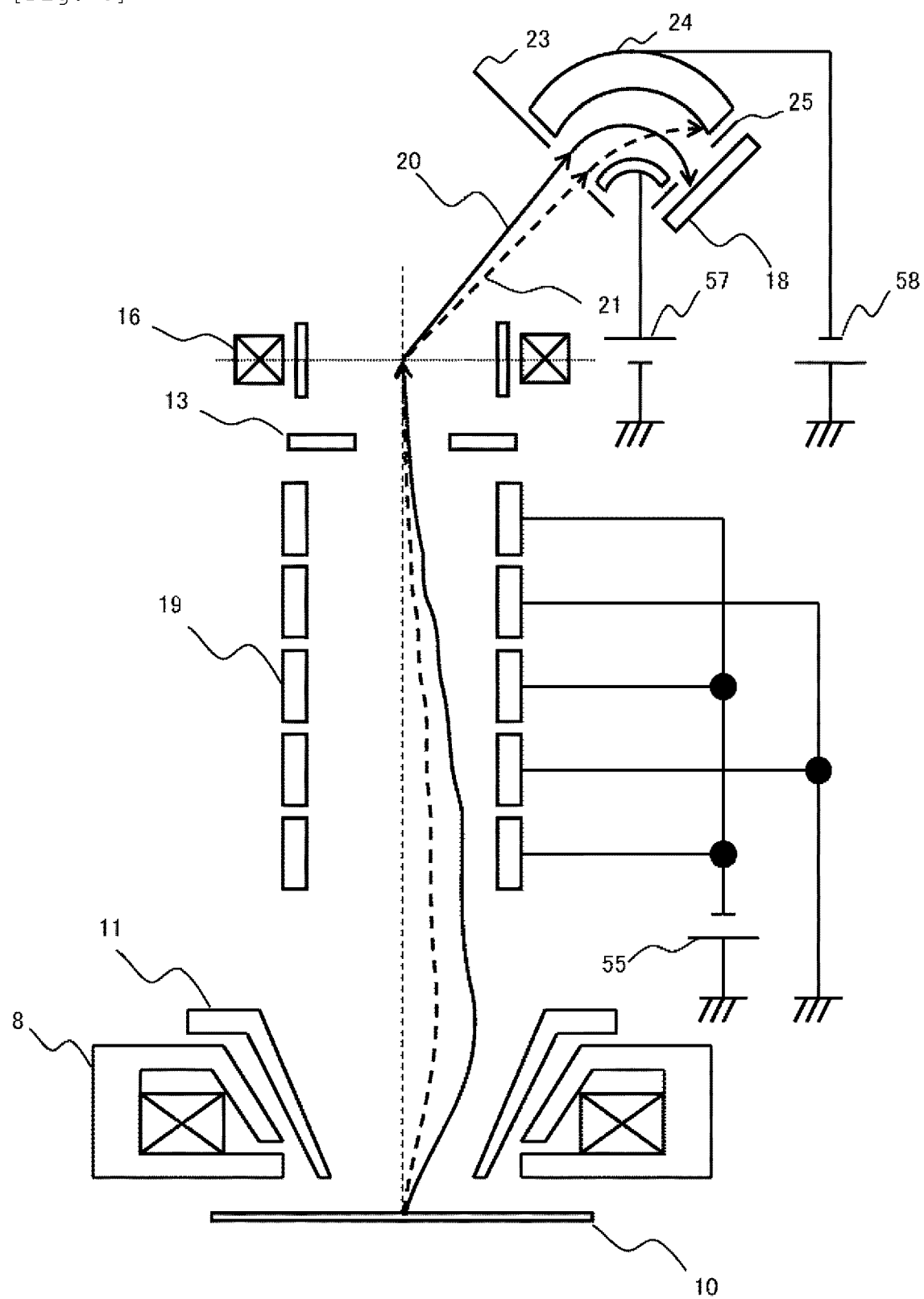

[Fig. 7]
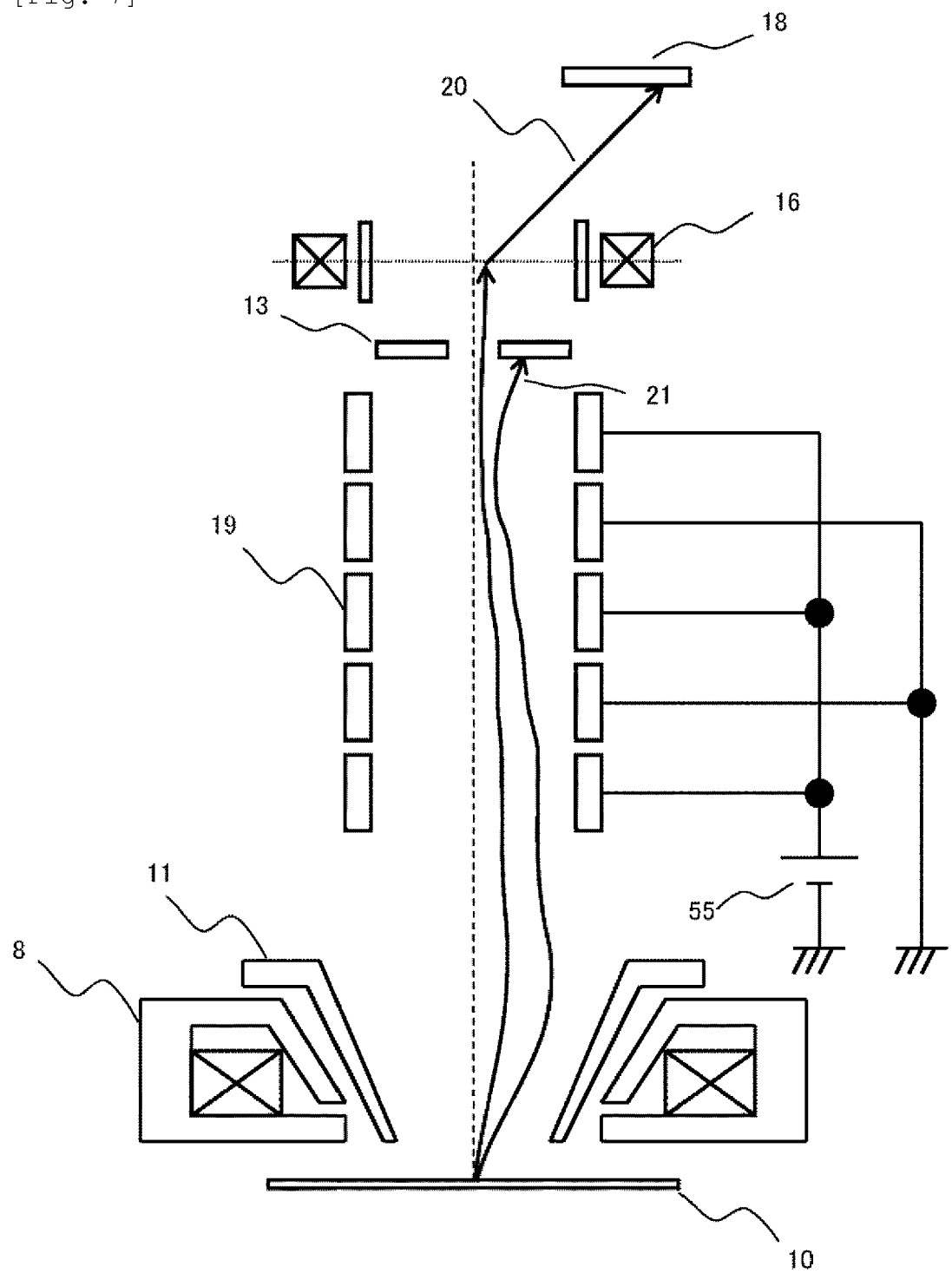

[Fig. 8]
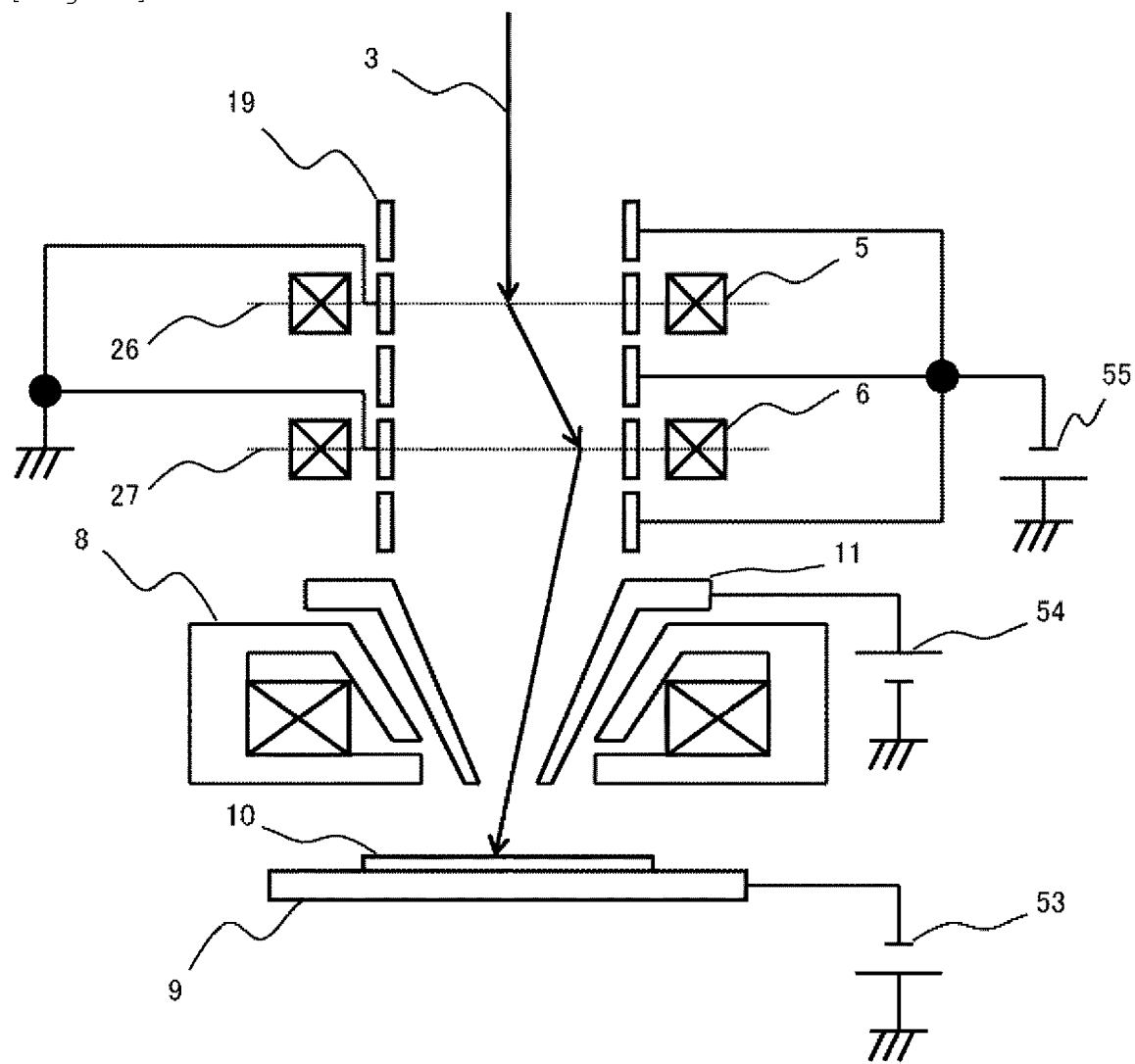
[Fig. 9]
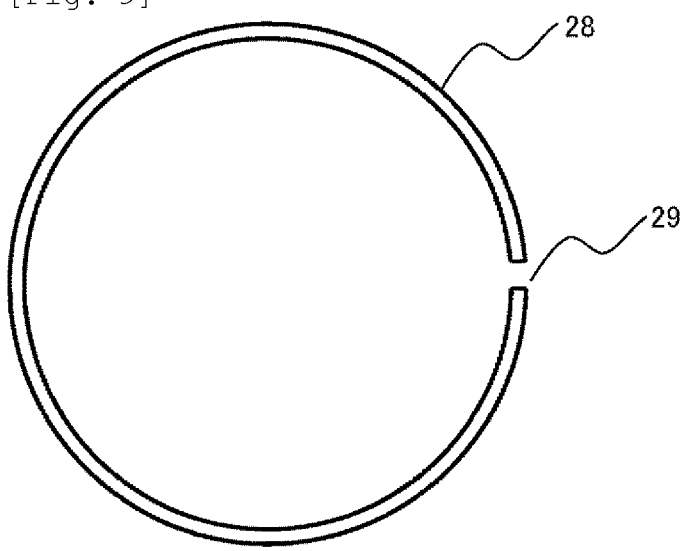

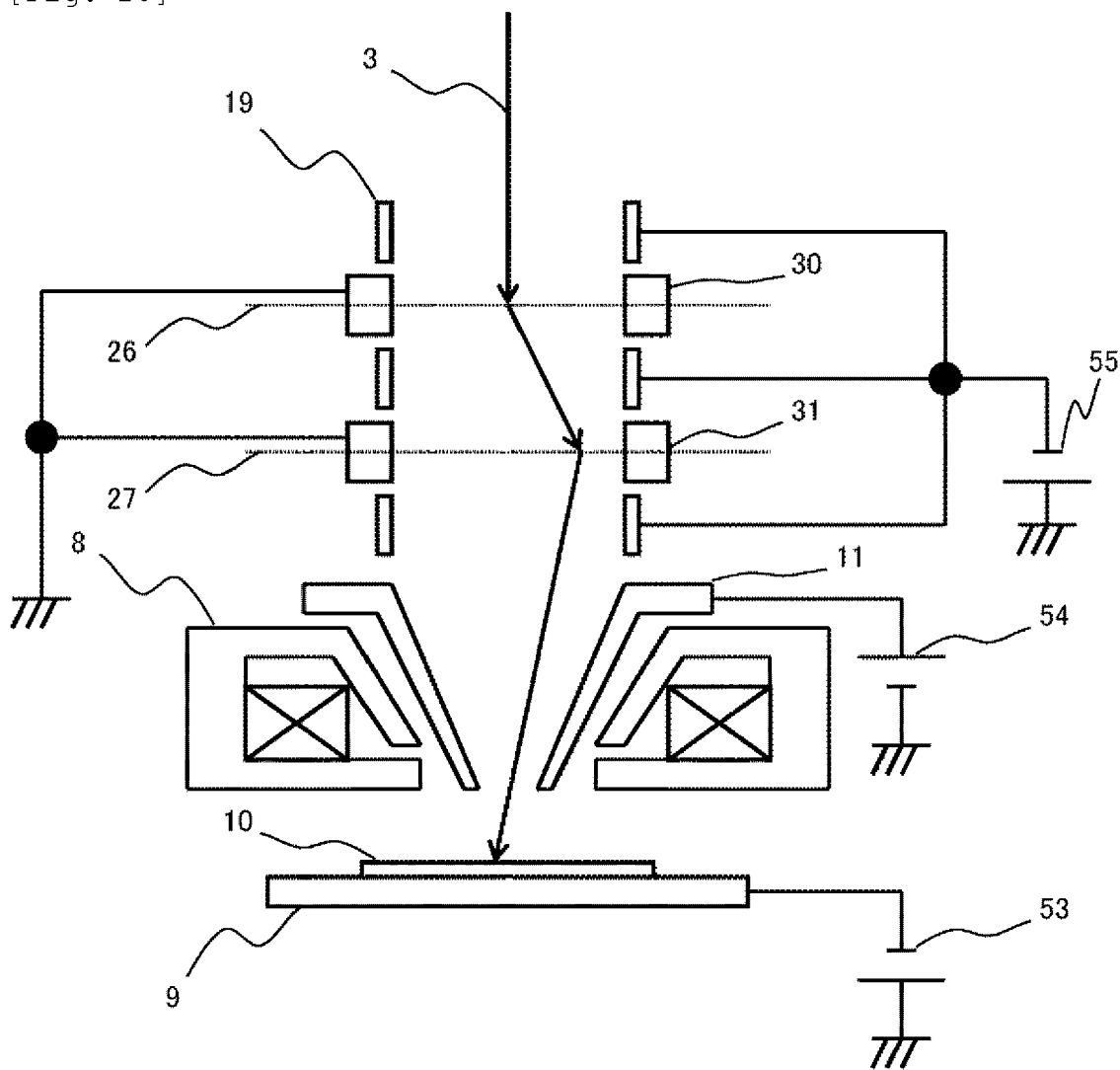
[Fig. 10]

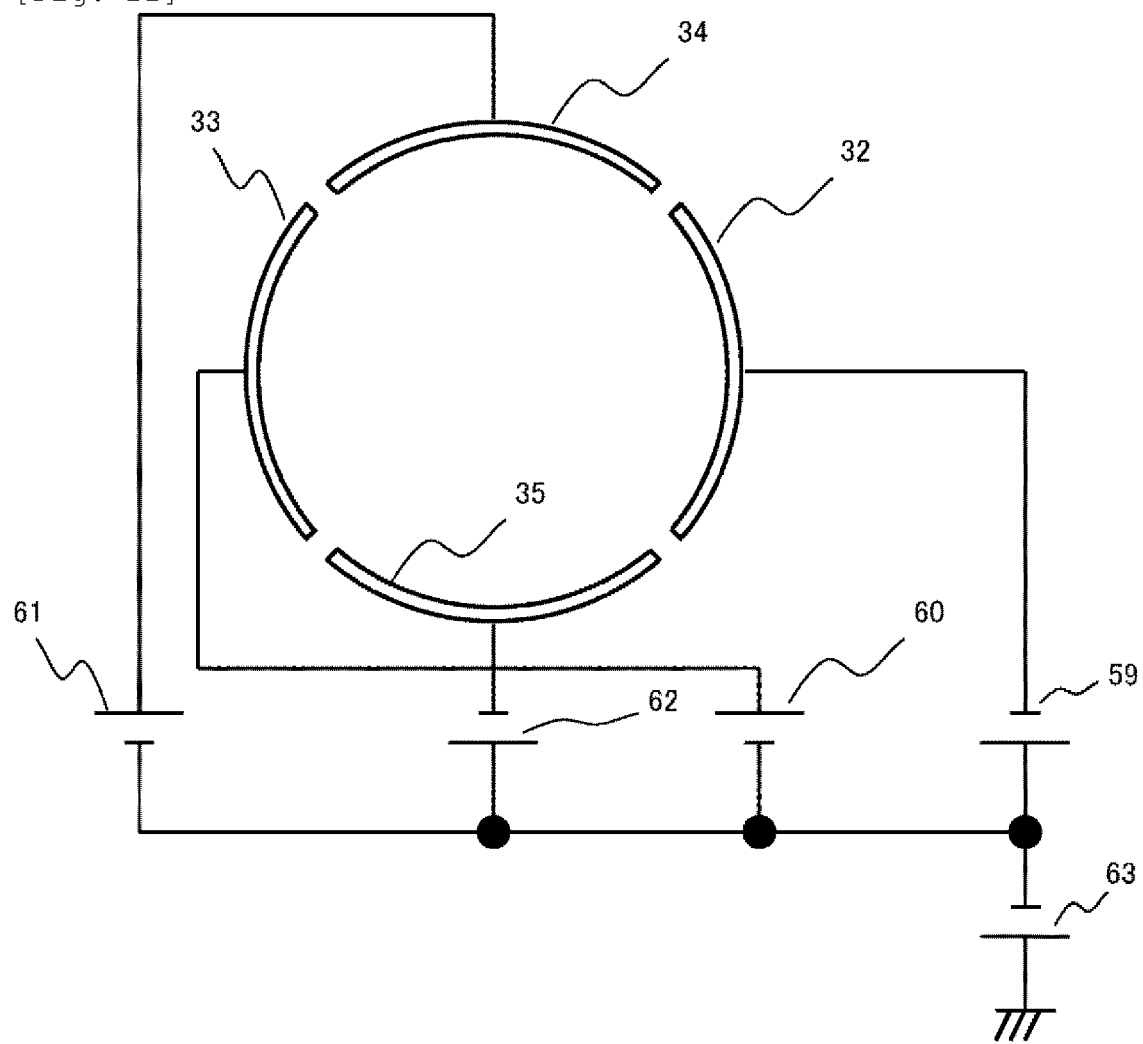
[Fig. 11]

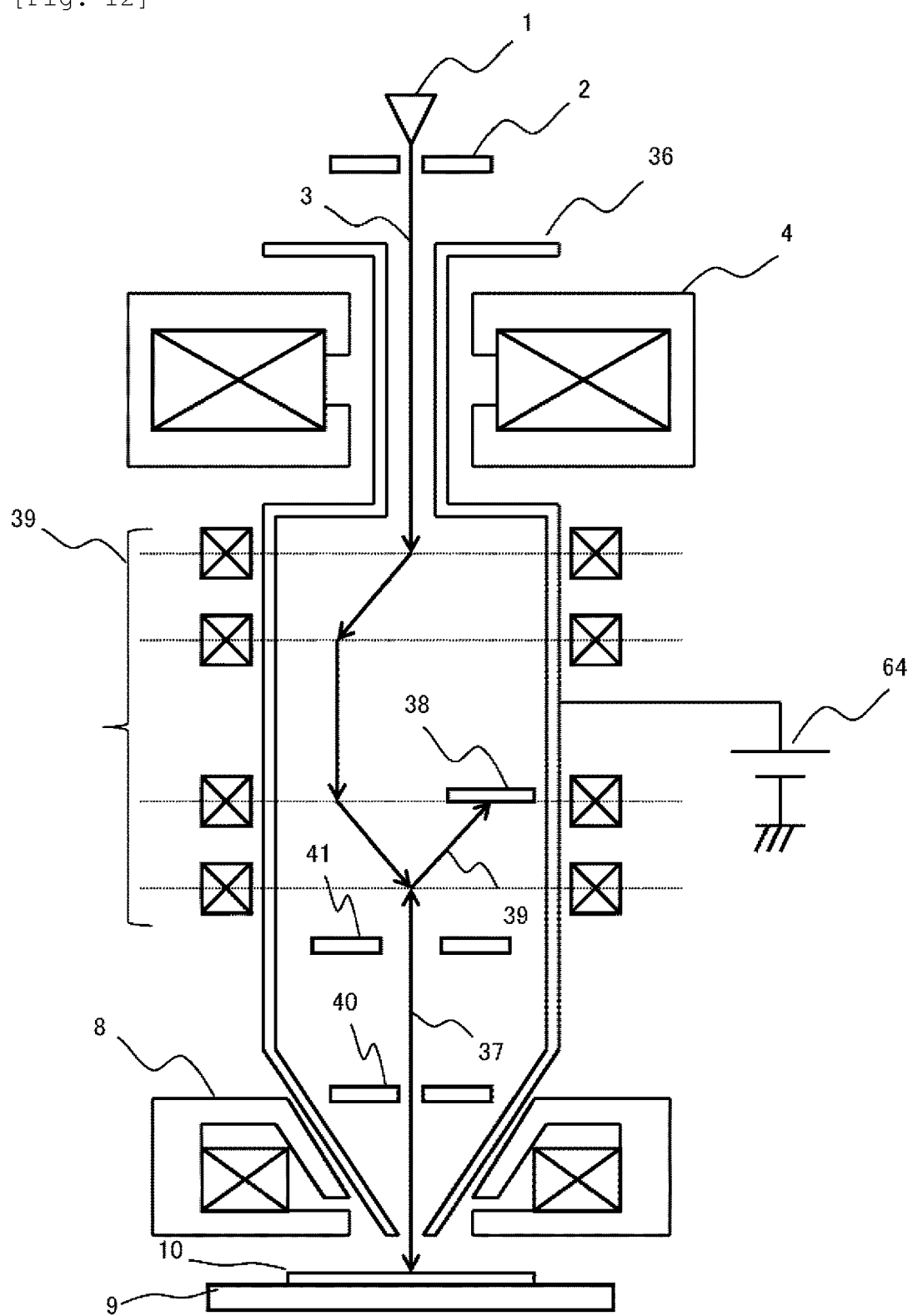
[Fig. 12]

[Fig. 13]
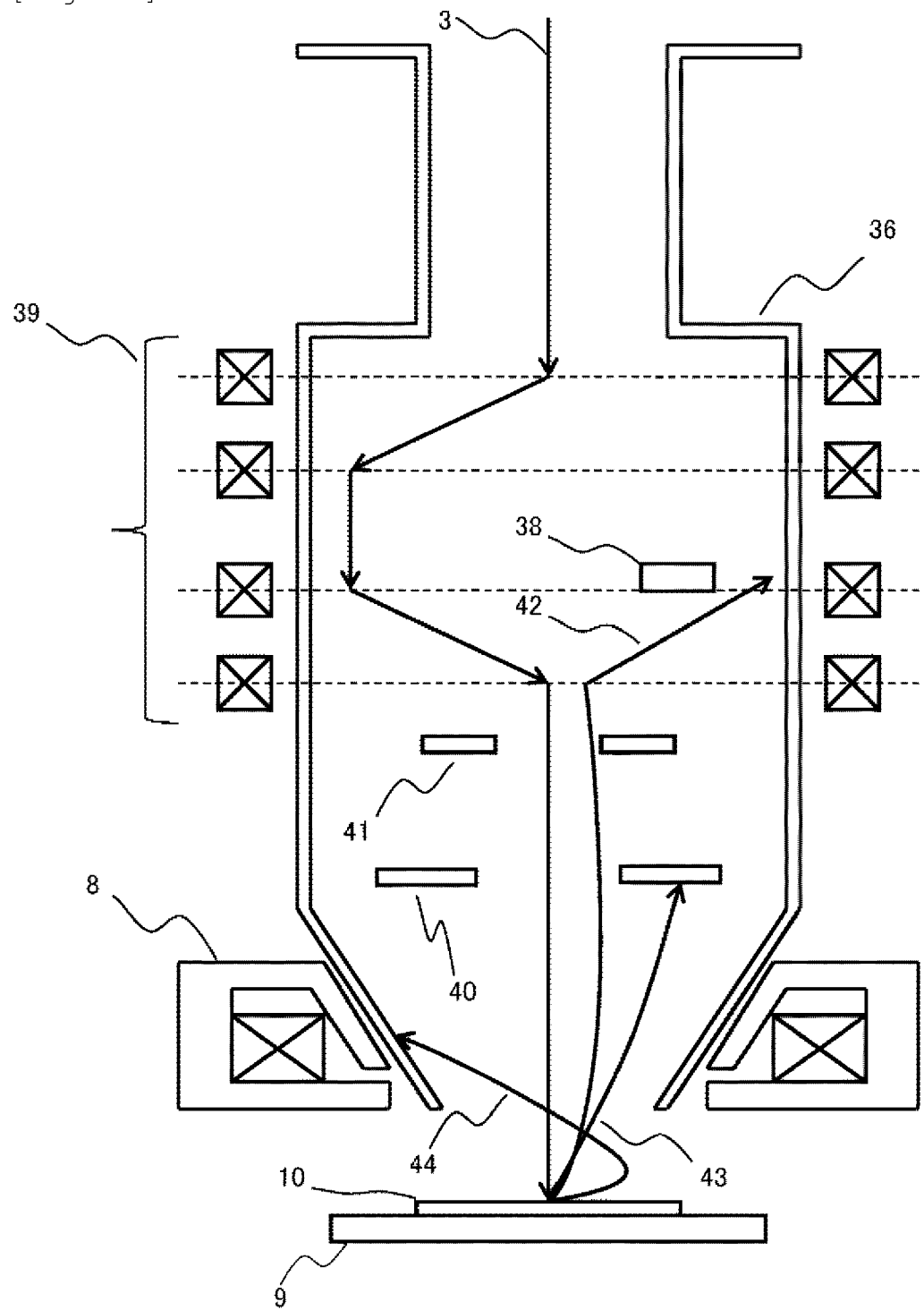

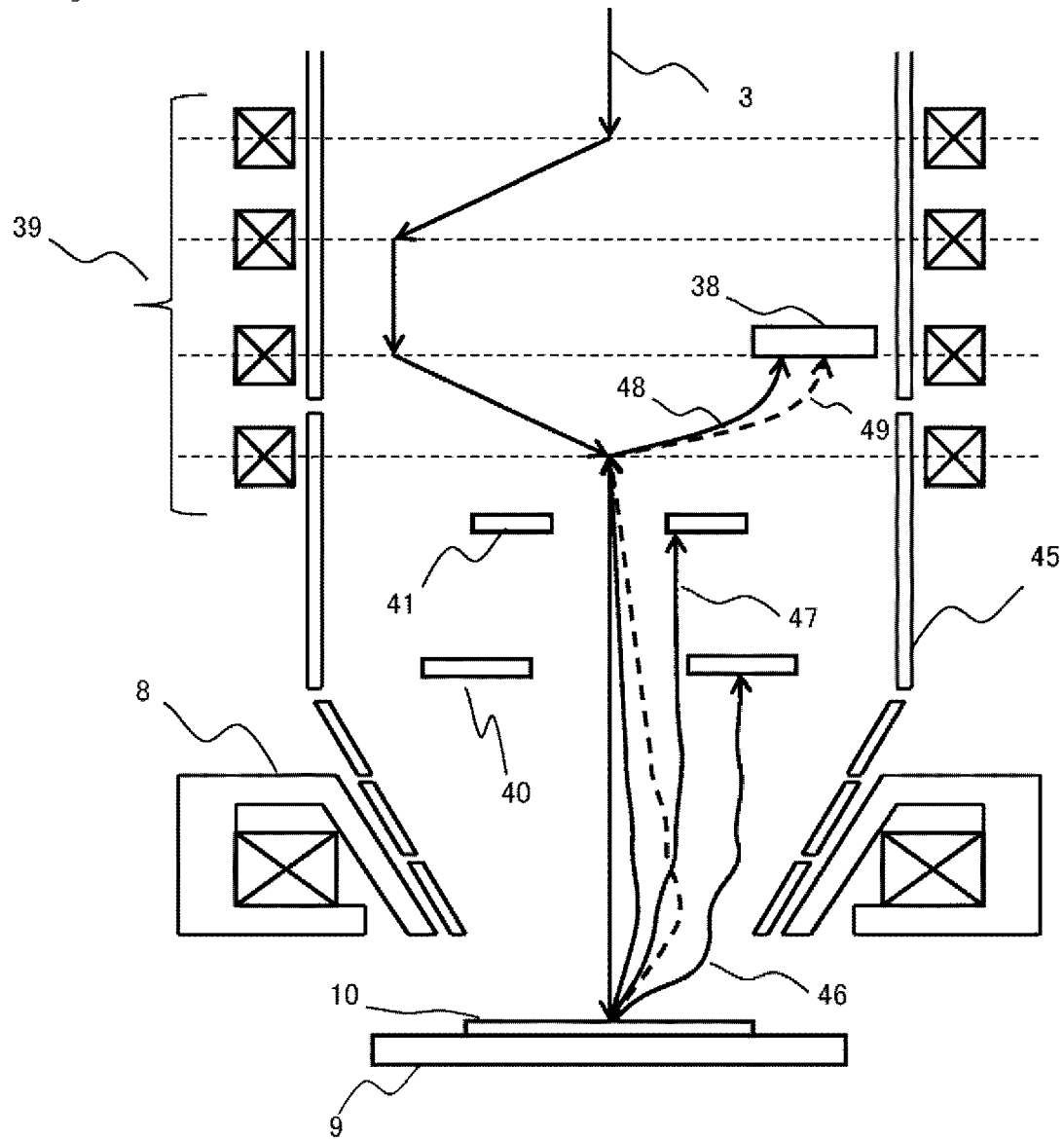
[Fig. 14]

[Fig. 15]
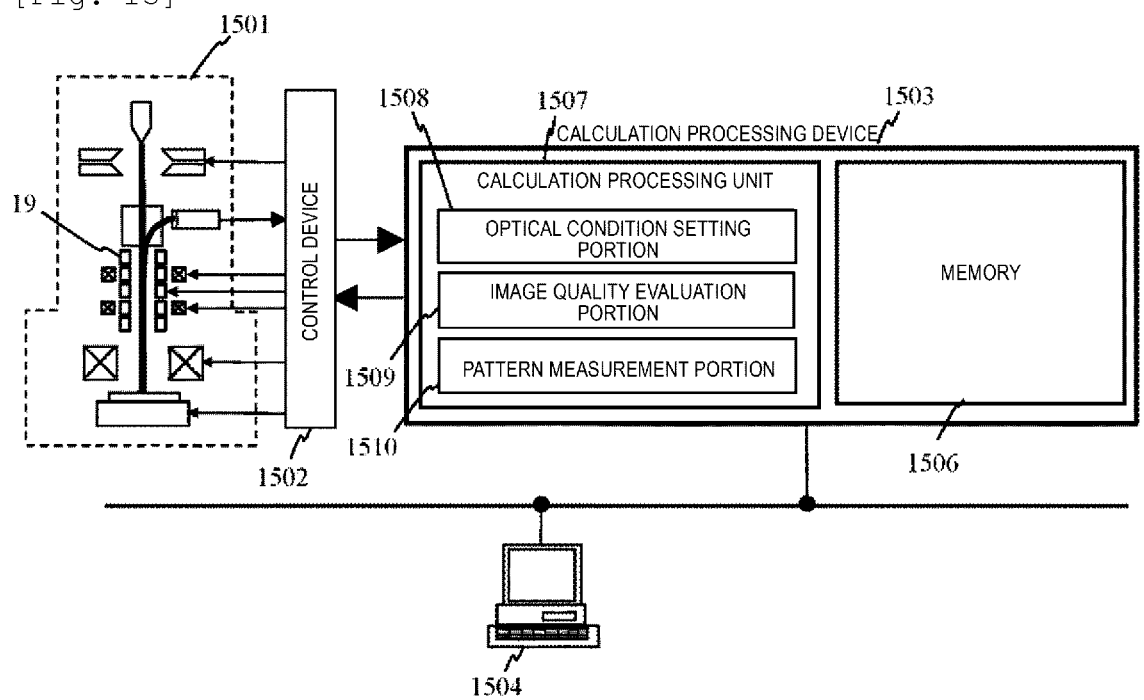
[Fig. 16]
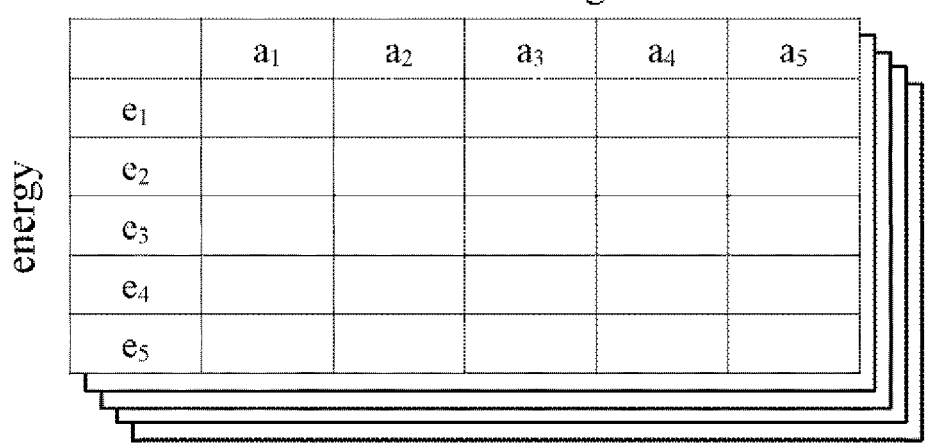

[Fig. 17]
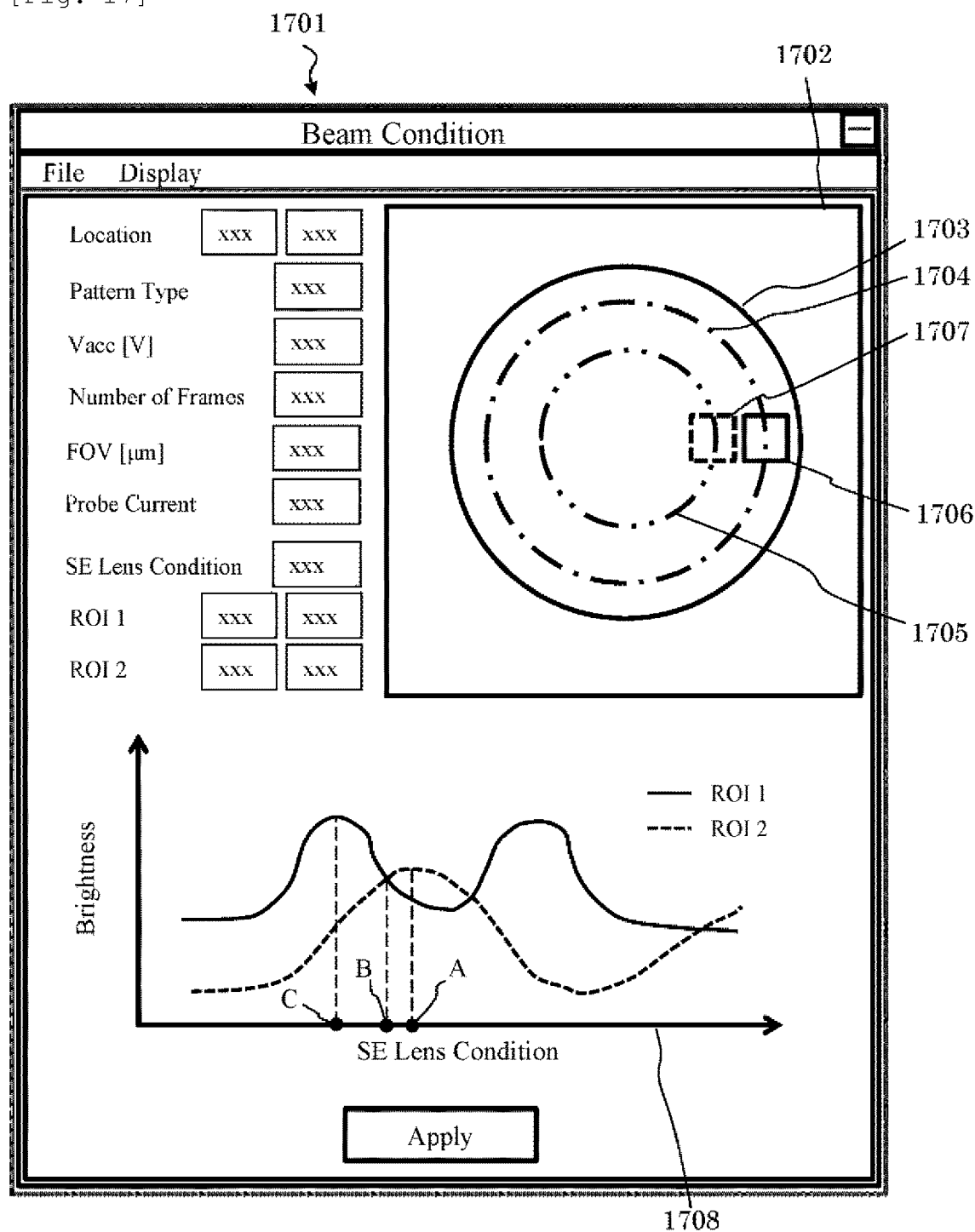

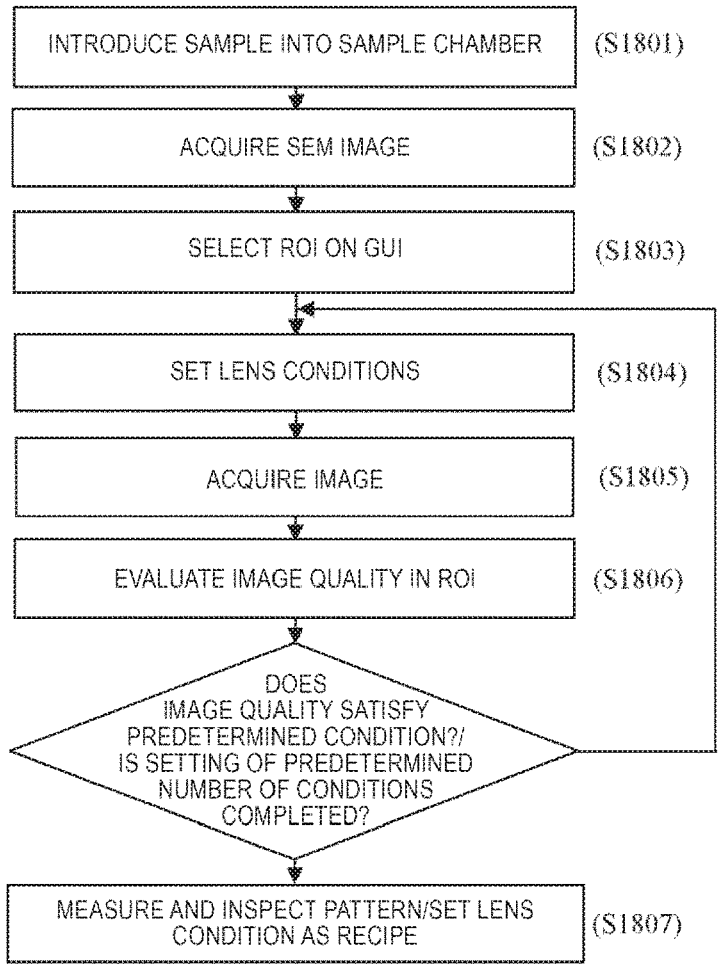
[Fig. 18]
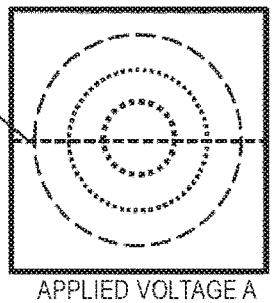
APPLIED VOLTAGE A
[Fig. 19A]
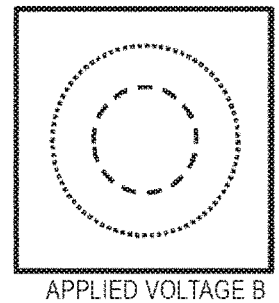
APPLIED VOLTAGE B
[Fig. 19B]
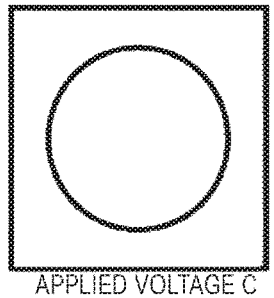
APPLIED VOLTAGE C
[Fig. 19C]
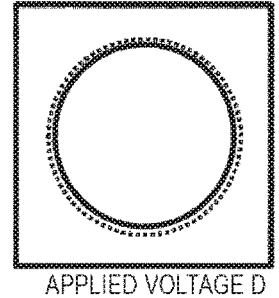
APPLIED VOLTAGE D
[Fig. 19D]

[Fig. 20]
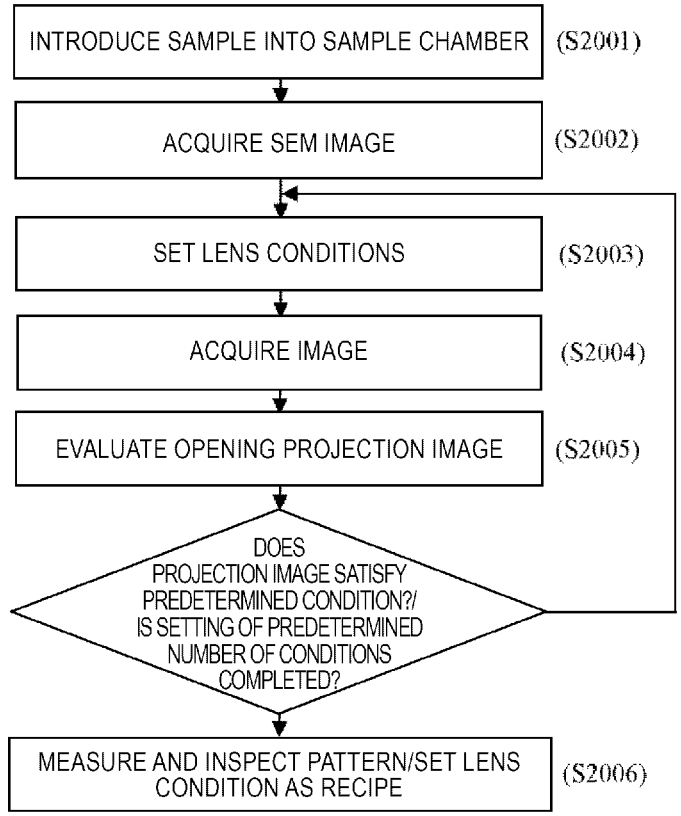
[Fig. 21]
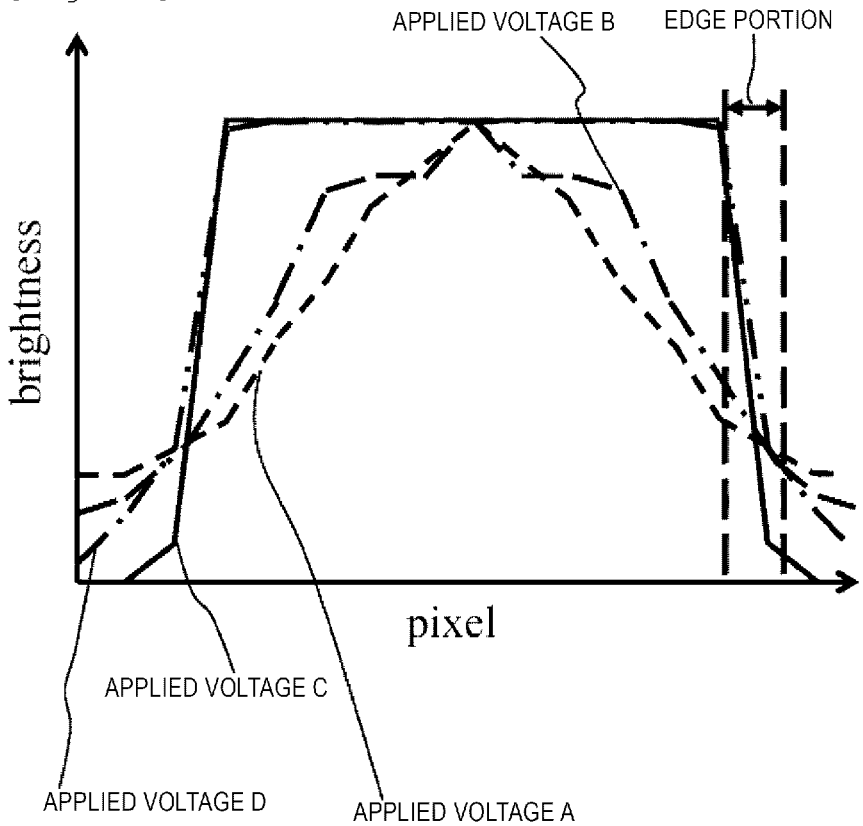

[Fig. 22]
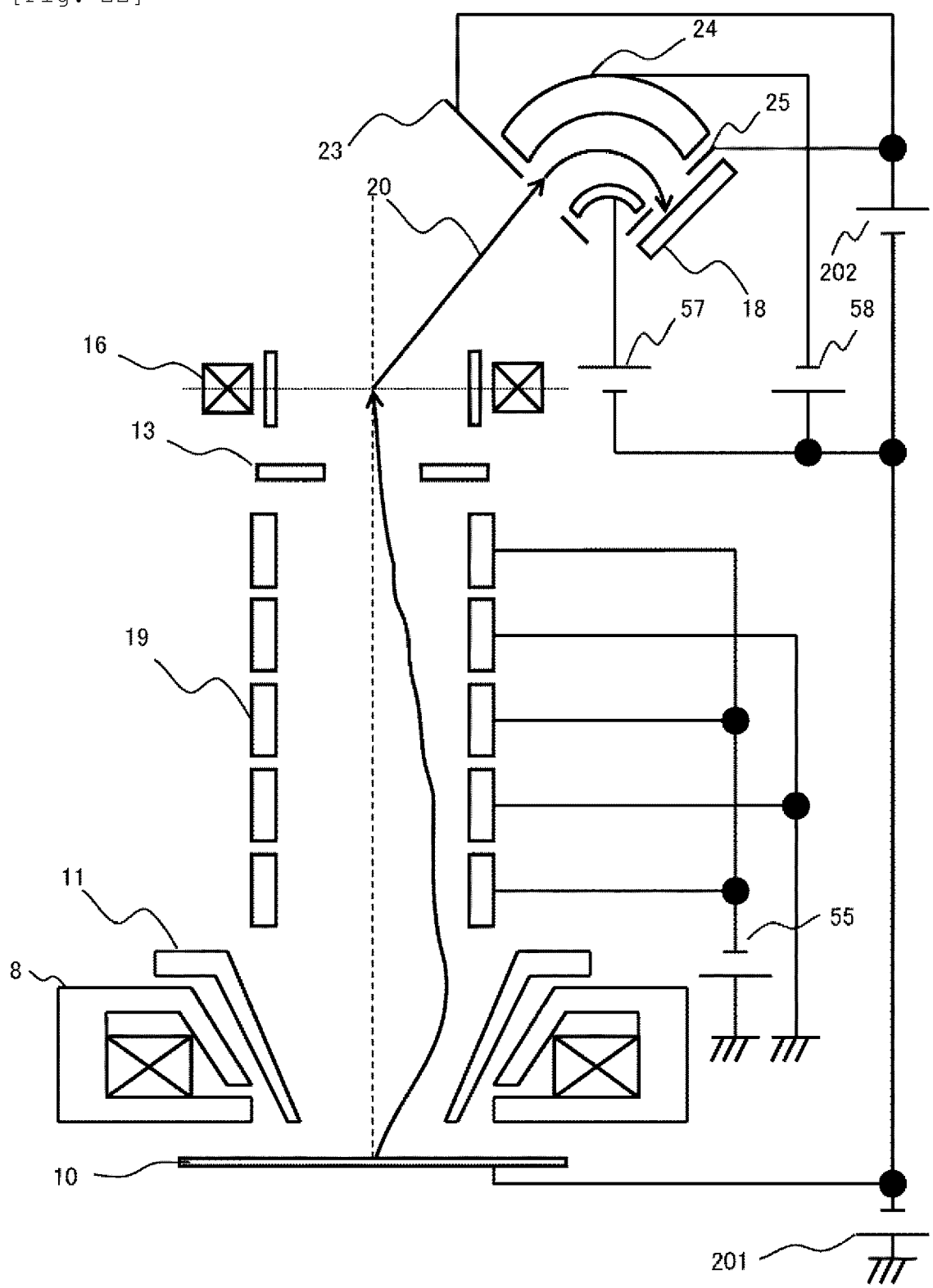

[Fig. 23]
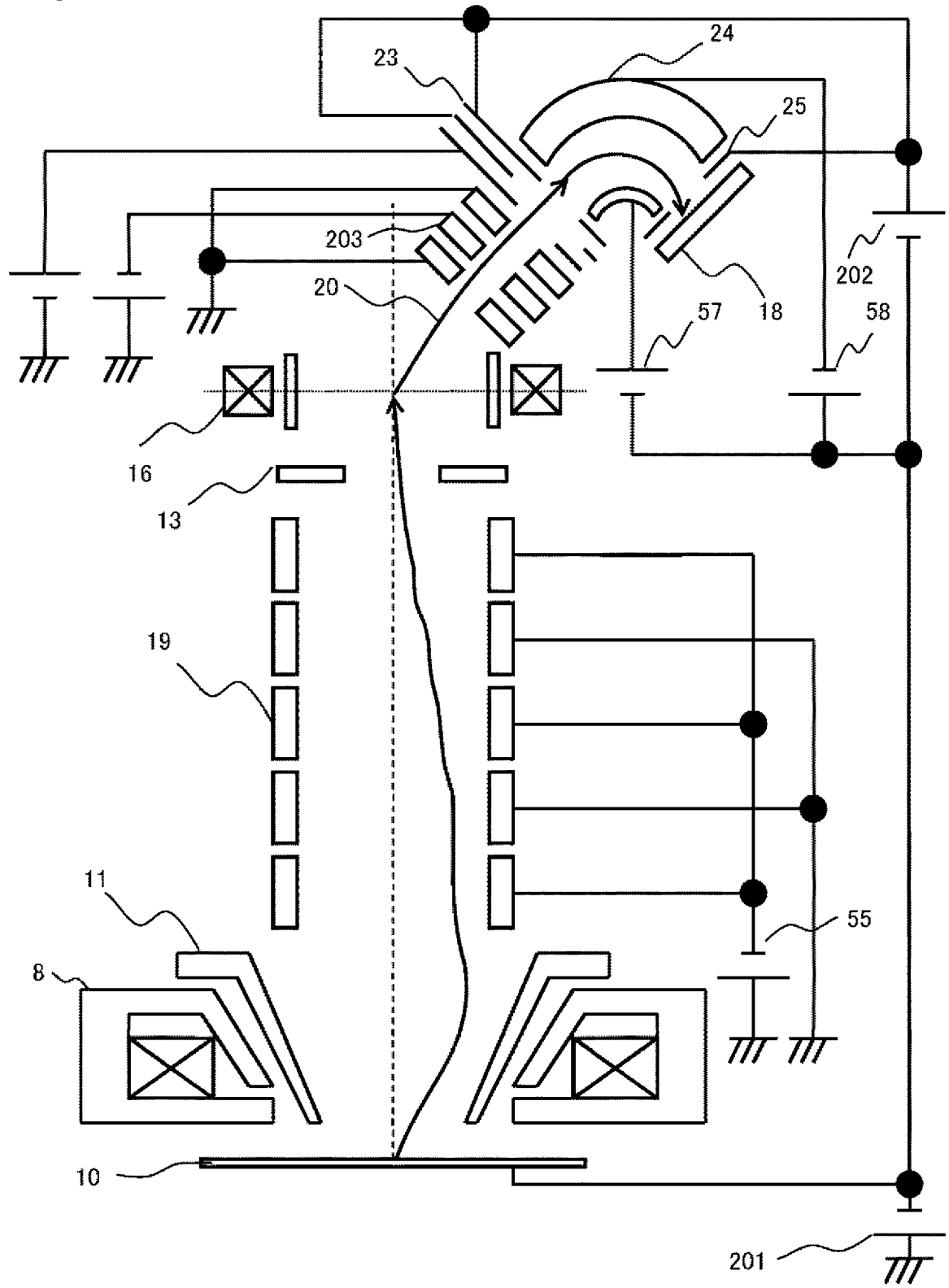

CHARGED PARTICLE BEAM DEVICE

TECHNICAL FIELD

The present invention relates to a charged particle beam device, and particularly to a charged particle beam device which reduces the influence exerted on a trajectory of a charged particle beam, and also controls trajectories of charged particles emitted from a sample.

BACKGROUND ART

With the progress of semiconductor devices in recent years, measurement and inspection techniques for semiconductors have been increasingly becoming more important. A scanning electron microscope typified by a critical dimension-scanning electron microscope (CD-SEM) is a device which scans a sample with an electron beam, and detects secondary electrons emitted from the sample so as to observe a pattern formed on a semiconductor device and measure a length thereof. In such a device, in order to perform highly accurate measurement and inspection, it is necessary to appropriately set conditions of the device and thus to control trajectories of secondary electrons.

Among scanning electron microscopes, a CD-SEM measures a length of a pattern, and thus the stability of a primary electron beam becomes considerably important. On the other hand, regarding secondary electrons, it is desirable to selectively detect secondary electrons having desired information by controlling trajectories thereof. For this, there is the need for a mechanism which changes only trajectories of secondary electrons without changing a trajectory of a primary electron beam.

In a scanning electron microscope, as an example of the mechanism which changes only trajectories of secondary electrons without changing a trajectory of a primary electron beam, PTL 1 discloses a method of detecting secondary electrons having desired information by separating trajectories of secondary electrons from trajectories of primary electrons by using a deflector based on an orthogonal electromagnetic field.

PTL 2 discloses a method of controlling the extent of convergence of secondary electrons on the basis of lens action using electrodes, thereby improving detection efficiency of secondary electrons.

CITATION LIST

Patent Literature

PTL 1: JP-A-2014-22040 (corresponding U.S. Pat. No. 8,648,300)
PTL 2: Japanese Patent No. 5478683 (corresponding U.S. Pat. No. 8,759,761)

SUMMARY OF INVENTION

Technical Problem

In the recent device pattern, a shape has become complicated, and constituent materials are remarkably diversified, and it has been difficult to obtain desired contrast in observation using a scanning electron microscope typified by a CD-SEM. Among electrons emitted from a sample, electrons which do not reach a detector, or conversion electrodes which are provided near the detector and causes secondary electrons due to collision with the electrons emitted from the sample, are not detected and are thus lost. For example, electrons which collide with the column inside of an electron microscope or electrons passing through an electron beam passing opening provided in a columnar detector do not reach the detector and are thus lost. In a case where the lost electrons have information required for measurement or inspection, sufficient contrast cannot be obtained, and it is hard to perform highly accurate measurement or inspection.

There is a case where it is desirable to selectively detect specific energy of secondary electrons or electrons with a radiation angle depending on a measurement purpose. There is a case where it is desirable to selectively detect electrons with specific energy.

In other words, in order to perform appropriate measurement and inspection while a semiconductor structure is miniaturized, it is desirable to reduce an amount of electrons lost without reaching a detector. It is desirable to detect an electron with a desired angle or energy with high efficiency among electrons emitted from at least a sample.

An orthogonal electromagnetic field deflector as disclosed in PTL 1 can guide secondary electrons to a detector with high efficiency without exerting great influence on primary electrons, but trajectories of the secondary electrons until reaching the orthogonal electromagnetic field deflector cannot be controlled, and depend on optical conditions such as an excitation amount in an objective lens. In a case where secondary electrons are lost until reaching the orthogonal electromagnetic field deflector, naturally, the secondary electrons cannot be detected.

In a method of causing secondary electron trajectories to converge with trapping electrodes as disclosed in PTL 2, secondary electrons with predetermined energy or radiation angle can be caused to converge, but secondary electrons with energy or radiation angle which is different therefrom cannot be controlled simultaneously. Even electrons emitted at the same angle may have differing energy, and, conversely, even electrons emitted at different angles may have the same energy. In the trapping electrodes disclosed in PTL 2, for example, in a case of electrons having the same energy, emitted in different directions, or electrons emitted in the same direction and having different pieces of energy, the electrons are deflected in different directions depending on the trapping electrodes due to the difference in the energy or the emission direction. As a result, electrons which can reach the detector and cannot reach the detector are generated. In this case, electrons with specific energy or a radiation angle may not be detected with high efficiency.

Hereinafter, a charged particle beam device capable of detecting charged particles emitted from a sample with high efficiency is proposed.

Solution to Problem

As an aspect for achieving the object, there is proposed a charged particle beam device including an objective lens that focuses a charged particle beam emitted from a charged particle source; a detector that is disposed between the objective lens and the charged particle source; a deflector that deflects charged particles emitted from the sample so that the charged particles are more separated from an axis than the charged particle beam; and a plurality of electrodes that are disposed between the deflector and the objective lens, and form a plurality of electrostatic lenses focusing the charged particles emitted from the sample toward a deflection point of the deflector.

As another aspect for achieving the object, there is proposed a charged particle beam device including an objective lens that focuses a charged particle beam emitted from a charged particle source; a detector that is disposed between the objective lens and the charged particle source; a deflector that deflects charged particles emitted from the sample so that the charged particles are more separated from an axis than the charged particle beam; an energy spectroscope that performs energy spectral analysis on the charged particles deflected by the deflector; and a negative voltage applying source that applies a negative voltage to the energy spectroscope and the sample or a sample stage mounted with the sample.

As still another aspect for achieving the object, there is proposed a charged particle beam device including a first lens that focuses a charged particle beam emitted from a charged particle source; an objective lens that focuses a charged particle beam applied to a sample; a detector that is disposed between the objective lens and the first lens; a deflector that deflects charged particles emitted from the sample so that the charged particles are more separated from an axis than the charged particle beam; and an acceleration cylinder that is formed to surround a passing trajectory of the charged particle beam reaching a passing opening of the charged particle beam in the objective lens from a passing opening of the charged particle beam in the first lens, and to which a positive voltage is applied, in which the acceleration cylinder is divided in an optical axis direction of the charged particle beam.

Advantageous Effects of Invention

According to the configuration, it is possible to detect charged particles emitted from a sample with high efficiency.

BRIEF DESCRIPTION OF DRAWINGS

FIG. 1 is a diagram illustrating a configuration of a scanning electron microscope.

FIG. 2 is a diagram illustrating secondary electron trajectories in the scanning electron microscope.

FIG. 3 is a diagram illustrating convergence action to which secondary electrons are subjected by a multistage electrostatic lens.

FIG. 4 is a diagram illustrating a combination between the multistage electrostatic lens and an energy filter.

FIG. 5 is a diagram illustrating a combination between the multistage electrostatic lens and a slit.

FIG. 6 is a diagram illustrating a combination between the multistage electrostatic lens and an energy spectroscope.

FIG. 7 is a diagram illustrating angle determination using the multistage electrostatic lens and a reflector opening.

FIG. 8 is a diagram illustrating a positional relationship between an electrostatic lens and a scanning deflector.

FIG. 9 is a diagram illustrating a structure of the electrostatic lens for suppressing an eddy current.

FIG. 10 is a diagram illustrating a combination between the electrostatic deflector and the multistage electrostatic lens.

FIG. 11 is a diagram illustrating an example in which the electrostatic deflector is operated as an electrostatic lens.

FIG. 12 is a diagram illustrating a configuration of an all-stage acceleration type scanning electron microscope.

FIG. 13 is a diagram illustrating secondary electron trajectories in the all-stage acceleration type scanning electron microscope.

FIG. 14 is a diagram illustrating secondary electron trajectory control using multistage of an all-stage acceleration cylinder.

FIG. 15 is a diagram illustrating an example of a measurement/inspection system including an SEM.

FIG. 16 is a diagram illustrating an example of a table storing lens conditions of the multistage electrostatic lens.

FIG. 17 is a diagram illustrating an example of a GUI screen for setting lens conditions of the multistage electrostatic lens.

FIG. 18 is a flowchart illustrating a process of selecting lens conditions of the multistage electrostatic lens.

FIG. 19 is a diagram illustrating an example FIGS. 19A-19D are diagrams illustrating examples of a SEM image corresponding to each of lens conditions of the multistage electrostatic lens.

FIG. 20 is a flowchart illustrating a process of extracting lens conditions of the multistage electrostatic lens.

FIG. 21 is a graph illustrating a relationship between a pixel position and luminance in a SEM image.

FIG. 22 is a diagram illustrating an example in which a retarding voltage is applied to an energy analyzer.

FIG. 23 is a diagram illustrating an example in which a retarding voltage is applied to the energy analyzer.

DESCRIPTION OF EMBODIMENTS

In Examples described below, a description will be made of a charged particle beam device which causes charged particles with different pieces of energy and radiation angles to have the same convergence point on the basis of convergence action obtained by electrostatic lenses in multiple stages, and controls a secondary charged particle trajectory separately from a primary charged particle trajectory by using a deflector based on an orthogonal electromagnetic field, disposed at the convergence point. The multistage electrostatic lenses are disposed between a charged particle source and an objective lens which focuses a charged particle beam.

More specifically, a description will be made of a charged particle beam device including an objective lens which focuses a charged particle beam emitted from a charged particle source; a detector which is disposed between the objective lens and the charged particle source; a deflector which deflects charged particles emitted from the sample so that the charged particles are more separated from an axis than the charged particle beam; and a plurality of electrodes which are disposed between the deflector and the objective lens, and form a plurality of electrostatic lenses focusing the charged particles emitted from the sample toward a deflection point of the deflector.

According to the configuration, it is possible to reduce a loss of secondary charged particles as much as possible, and then to control trajectories of the secondary charged particles separately from primary charged particles.

Hereinafter, an embodiment and Examples will be described with reference to the drawings. However, in the following description, the same constituent elements are given the same reference numerals, and repeated description will be omitted. In the following description, a scanning electron microscope (SEM) which scans a sample with an electron beam will be described as an example, but the present invention is not limited thereto, and may be applied to, for example, other charged particle beam devices such as a focused ion beam (FIB) device. The embodiment describes only an example of a scanning electron microscope, and may be applied to a scanning electron microscope with a configuration which is different from that of the embodiment.

FIG. 1 is a diagram illustrating a configuration of a scanning electron microscope. In a scanning electron microscope 101, an extraction electric field is formed between a field emission cathode 1 to which a cathode voltage 51 is applied and an extraction electrode 2 to which an extraction voltage 52 superposed on the cathode voltage 51 is applied, and thus a primary electron beam 3 appears.

The primary electron beam (charged particle beam) 3 appearing in the above-described way is subjected to focusing due to a condenser lens 4 and scanning deflection due to an upper scanning deflector (first deflector) 5 and a lower scanning deflector (second deflector) 6. An objective aperture 7 which controls the intensity of the primary electron beam 3 and a divergence angle is disposed between the extraction electrode 2 and the condenser lens 4. The deflection intensities of the upper scanning deflector 5 and the lower scanning deflector 6 are adjusted so that a sample 10 set on a holder 9 to which a sample voltage 53 is applied is two-dimensionally scanned with the lens center of an objective lens 8 as a fulcrum.

The primary electron beam 3 deflected by the upper scanning deflector 5 and the lower scanning deflector 6 is further accelerated by a rear-stage acceleration cylinder 11 to which a rear-stage acceleration voltage 54 is applied and which is provided on a passage of the objective lens 8. The rear-stage acceleration cylinder 11 forms an electric field for accelerating the primary electron beam 3. The primary electron beam 3 subjected to rear-stage acceleration is narrowed due to the lens action of the objective lens 8.

Secondary electrons or electrons (charged particles) such as backscattering electrons emitted from a sample 10 are accelerated in an opposite direction to an irradiation direction of the primary electron beam 3 by an electric field which is formed between the sample 10 to which the negative sample voltage 53 is applied and the rear-stage acceleration cylinder 11. A secondary electron 12 collides with a reflection plate 13 so as to be converted into a tertiary electron (charged particle) 14, and the tertiary electron 14 is guided to a lower detector 15 so that an SEM image is formed. The reflection plate 13 has a hole through which the primary electron beam 3 passes, and is disposed between the condenser lens 4 and the objective lens 8. An annular detector may be disposed at a position of the reflection plate 13 instead of the lower detector 15.

An orthogonal electromagnetic field deflector 16 which deflects a secondary electron beam is disposed between the condenser lens 4 and the reflection plate 13. The orthogonal electromagnetic field deflector 16 has deflection action using both a magnetic field and an electric field. The magnetic field and electric field intensities of the orthogonal electromagnetic field deflector 16 are adjusted so that the primary electron beam 3 is not changed, and a secondary electron beam 17 having passed through the reflection plate 13 reaches an upper detector 18 so as to be more separated from the axis than the primary electron beam 3.

Multistage electrostatic lenses 19 of at least two or more stages which are disposed on the same axis as the upper scanning deflector (first deflector) 5 and the lower scanning deflector (second deflector) 6 are disposed between the objective lens 8 and the reflection plate 13. In the multistage electrostatic lenses 19, electrostatic lenses to which a negative electrostatic lens voltage 55 is applied and electrostatic lenses to which a ground potential is applied are alternately disposed. The secondary electron 17 emitted from the sample 10 is subjected to convergence action by the multistage electrostatic lenses 19 in order. The convergence action can be adjusted by using the negative electrostatic lens voltage 55, and thus it is possible to change energy and radiation angles of the secondary electron passing through the reflection plate 13. The electrostatic lens occurs due to an electric field generated by a voltage which is applied to an electrode, but, for convenience, in the present specification, the electrode may also be referred to as a lens.

The electrons detected by the lower detector 15 and the upper detector 18 are amplified by amplifiers, and are displayed on an image display device in synchronization with scanning signals supplied to the upper scanning deflector 5 and the lower scanning deflector 6. A current or a voltage applied to each constituent element of the scanning electron microscope 101 may be controlled by using a control device provided separately from the scanning electron microscope body. The control device includes a CPU, a frame memory, and a storage device storing a program and data.

Next, a description will be made of secondary electron trajectory control using the convergence action of the multistage electrostatic lenses. FIG. 2 illustrates examples of secondary electron trajectories in an SEM without multistage electrostatic lenses. In this device configuration, secondary electron trajectories are defined depending on an excitation amount in the objective lens 8 or conditions for the rear-stage acceleration cylinder 11. In other words, a secondary electron trajectory is defined depending on irradiation conditions for the primary electron beam 3, and thus the secondary electron trajectory cannot be controlled independently. For example, the secondary electron 14 reaching the reflection plate 13 cannot pass through the reflection plate 13 and thus cannot be detected with the upper detector 18. In an optical condition in which a secondary electron trajectory diverges when the secondary electron 17 having passed through the reflection plate 13 is deflected with the orthogonal electromagnetic field deflector 16 so as to be detected with the upper detector 18, the number of secondary electrons 17 passing through the reflection plate 13 is reduced, and thus an amount of a detected signal is also reduced in the detector 18. Therefore, a SEM image with high contrast cannot be obtained. The secondary electron 19 which collides with a column inner wall and is lost cannot be detected, and this reduces contrast.

Example 1

FIG. 3 illustrates a configuration example of a charged particle beam device in which the multistage electrostatic lenses 19 in five stages are disposed. FIG. 3 illustrates electrostatic lenses formed of electrodes in five stages, but the number of stages of electrostatic lenses is not limited as long as the number of stages is two or more. FIG. 3 illustrates a configuration in which a negative potential and a ground potential are alternately arranged as an example, but the polarity and the magnitude of a potential applied to each electrostatic lens are not limited.

Here, both of secondary electrons 20 and 21 with different pieces of energy or radiation angles converge on an action point of the orthogonal electromagnetic field deflector due to the convergence action of the multistage electrostatic lenses 19. Both of the secondary electrons 20 and 21 can be detected by the upper detector 18 due to an operation of the orthogonal electromagnetic field deflector 16.

Since the multistage electrostatic lenses 19 are operated, a secondary electron which collides with the column inner wall and is thus lost has the same trajectory as that of the secondary electron 20 due to the convergence action, and thus it is possible to prevent a loss thereof. Since each of the electrostatic lenses is a convex lens, and causes only the convergence action, the secondary electrons 20 and 21 with different pieces of energy and radiation angles can be caused to converge on the same point, so as to be detected by the upper detector 18. Such secondary electron trajectory control cannot be performed in the SEM with the configuration exemplified in FIG. 2.

In a case where a charged particle beam is an electron, the electron easily converges due to repellent force by applying a negative potential to the electrostatic lens. Naturally, the convergence action is strengthened by increasing an electrostatic lens potential or reducing a gap between the lenses.

According to the present example, electrons emitted in various directions or electrons with different pieces of energy can be directed to and converge on the action point (deflection point) of the orthogonal electromagnetic field deflector 16 by using a plurality of electrostatic lenses formed among the plurality of electrodes. Therefore, it is possible to highly efficiently detect electrons emitted from a sample, or tertiary electrons obtained when the electrons collide with a reflection plate or the like.

Trajectories of electrons emitted from a sample are caused to gradually converge (the electrons are directed toward the deflection point) by the multistage lenses. Therefore, it is possible to reduce a divergence angle of the electrons passing through the reflection plate 13 and thus to improve detection efficiency of the upper detector 18. For example, in a case where trajectories of electrons are caused to converge by using electrodes in a single stage, it is necessary to apply a large voltage to the electrodes in order to cause electrons in a plurality of directions to converge. As a result, the electrons reach the opening of the reflection plate 13, and a divergence angle of the electrons passing through the opening increases. If the divergence angle increases, the number of electrons directed in directions other than the direction of the upper detector 18 increases, and thus detection efficiency is reduced. On the other hand, the multistage lenses can cause trajectories of electrons to gradually converge so as to reduce a divergence angle, and thus it is possible to highly efficiently detect electrons emitted from a sample.

Example 2

FIG. 4 illustrates an example in which a mesh-like energy filter 22 is disposed in the front stage of the upper detector 18. A negative energy filter voltage 56 is applied to the energy filter 22 in order to return secondary electrons with energy which is equal to or lower than predetermined energy. In order to improve a resolution of the energy filter 22, and to perform appropriate energy separation, a mesh of the energy filter 22 is disposed to be perpendicular to a trajectory of a secondary electron.

This example shows that the secondary electron 20 has higher energy than that of the secondary electron 21. In this case, if a negative potential is applied to the energy filter 22, the energy filter functions as a high-pass filter, and thus it is possible to form an image using only secondary electrons having energy higher than, for example, the energy of the secondary electron 20. Since the number of secondary electrons reaching the energy filter is increased due to the convergence action of the multistage electrostatic lenses 19, even if secondary electrons having energy which is equal to or less than predetermined energy are cut, a SEM image in which a signal amount is large can be obtained.

Example 3

FIG. 5 illustrates an example in which a slit 23 is disposed in the front stage of the upper detector 18. Since a deflection amount in the orthogonal electromagnetic field deflector 16 can be arbitrarily changed, energy of a secondary electron reaching the slit 23 can be arbitrarily controlled. For example, when the energy of the secondary electron 20 is higher than the energy of the secondary electron 21, if a deflection amount in the orthogonal electromagnetic field deflector 16 is set to intensity at which the secondary electron 20 passes through the slit 23, a band-pass image using only the secondary electron 20 can be formed.

In order to determine energy at the slit 23, it is necessary for secondary electrons having energy in an inherently wide range to reach the orthogonal electromagnetic field deflector 16. In the configuration of the SEM device of the related art having no multistage electrostatic lenses, trajectories of secondary electrons diverge, and only secondary electrons having specific energy reach an action point of the orthogonal electromagnetic field deflector 16, and thus no energy can be determined.

Example 4

FIG. 6 illustrates an example in which an energy spectroscope 24 is disposed in the front stage of the upper detector 18. The energy spectroscope 24 includes an emission slit 25 in order to improve an energy resolution. Here, the energy spectroscope using a circular sector is illustrated as an example, but is not limited to this structure as long as energy spectral analysis is possible. Here, a power source for subjecting secondary electrons to energy spectral analysis is provided, and a positive sector voltage 57 and a negative sector voltage 58 are respectively applied to an inner electrode and an outer electrode.

The energy spectral analysis can be performed by using only the slit 23, but if there is a variation between angles at which secondary electrons arrive the orthogonal electromagnetic field deflector 16, there is also a variation between pieces of energy of the secondary electrons passing through the slit 23, and thus an energy resolution deteriorates. Therefore, the energy spectroscope 24 is disposed in the rear stage of the slit 23, and thus a band-pass image can be acquired in a state of further improving an energy resolution.

By employing the multistage lenses controlling trajectories of secondary electrons, it is possible to improve the yield of electrons having the same energy among electrons emitted in various directions. Thus, even if a detection amount is reduced, it is possible to prevent the influence of the reduction through energy spectral analysis.

Since an energy resolution $\Delta E$ of the energy spectroscope 24 is determined depending on "$\Delta E/E$=constant", energy E of the secondary electron 20 which is spectrally analyzed by the energy spectroscope 24 is required to be reduced in order to improve $\Delta E$.

Therefore, as illustrated in FIG. 22, a deceleration voltage 201 applied to the sample 10 is applied to an inner sector 57 and an outer sector 58 of the energy spectroscope 24, and thus $\Delta E$ is reduced. In order to improve $\Delta E$ in an optical system in which the deceleration voltage 201 is applied to the sample 10 (or a sample stage on which the sample is placed), the inner sector voltage 57 and the outer sector 58 applied to the energy spectroscope 24 may be floated with the deceleration voltage 201, and thus the energy of the secondary electron 20 passing through the energy spectroscope 24 may be reduced.

A potential close to the deceleration voltage 201 is set for the slit 23 and the emission slit 25 in order to suppress divergence of a trajectory of the secondary electron 20. For this, a slit voltage 202 may be superposed on the deceleration voltage 201. The slit voltage 202 may be a positive potential of about several V which is sufficiently smaller than the deceleration voltage 201 in an absolute value in order for the secondary electron 20 not to be returned.

The secondary electron 20 which reaches the orthogonal electromagnetic field deflector 16 due to the multistage electrostatic lenses 19 converges in a diameter direction, but is a secondary electron and thus has an energy distribution. Thus, the secondary electron reaches the slit 23 while a trajectory thereof diverges due to color distribution. In order to prevent this, as exemplified in FIG. 23, a condenser electrostatic lens 203 (electrodes in a plurality of electrodes) is disposed in front of the slit 23. The condenser electrostatic lens 203 may have a structure in which an electrode to which a negative potential is applied is interposed between electrodes to which a ground potential is applied.

The energy resolution is improved as an angular distribution of the secondary electron 20 at an incidence portion of the energy spectroscope 24 becomes smaller. In order to reduce a divergence angle of the secondary electron 20, it is effective to form the slit 23 (electrodes in a plurality of stages) in multiple stages. The example illustrated in FIG. 23 shows a three-slit structure. A high positive potential of several kV is applied to the first slit on the optical axis side, so as to accelerate the secondary electron 20, and thus the angular distribution is reduced. The second slit has a function of reducing the angular distribution by reducing distortion of an electric field. Since the angular distribution is reduced, a trajectory of a secondary electron can be made to have a small angle, and thus the secondary electron can be introduced into the incidence portion of the energy spectroscope.

The second and third slits can prevent intrusion of an electric field formed by the first slit to which a voltage of several kV is applied. Since the electric field formed by applying the voltage of several kV is considerably strong, if the electric field is oozed out to the incidence portion of the energy spectroscope, this causes an angular distribution of a secondary electron, and thus the energy resolution deteriorates. Therefore, in the example illustrated in FIG. 23, two slits are disposed between the first slit to which a voltage of several kV is applied and the energy spectroscope, so as to form a structure of preventing the electric field from being oozed out to the energy spectroscope. A single slit has an effect of reducing oozing-out of an electric field, but two slits have a greater effect, and thus two slits are preferably provided. The reason why the positive potential of about several V with respect to a retarding voltage Vr which is applied to the sample is applied to the second and third slits is that, if the same potential as Vr is applied, secondary electrons are returned due to a potential barrier depending on incidence angles of the secondary electrons to the energy spectroscope, and thus secondary electrons which cannot be acquired are generated.

Example 5

If a polarity of a multistage electrostatic lens voltage 55 applied to the multistage electrostatic lenses 19 is set to be positive, a radiation angle of a secondary electron can be determined and detected. As illustrated in FIG. 7, the multistage electrostatic lenses 19 and the opening of the reflection plate 13 are used. Even in a case where a positive voltage is applied to the multistage electrostatic lenses 19, secondary electrons are subjected to convergence action due to the property of the electrostatic lenses. However, if the electrostatic lens (electrode) in the front stage (a position close to the reflection plate) of the reflection plate 13 is set to a positive potential, electrons such as the secondary electron 21 separated from the optical axis diverge from the reflection plate 13 due to positive electric field action. The magnitude of divergence of a trajectory can be controlled depending on the magnitude of the positive voltage 55 applied to the multistage electrostatic lenses 19, and thus secondary electrons passing through the opening of the reflection plate 13 (a passing opening-formed member having a passing opening through which a primary electron beam passes) can be changed.

A secondary electron (for example, the secondary electron 20) whose radiation angle from the sample 10 is small when viewed from the optical axis passes through the vicinity of the opening center of the reflection plate 13, and a trajectory of a secondary electron (for example, the secondary electron 21) whose radiation angle is large is separated from the opening center of the reflection plate 13. Therefore, if divergence action is increased, it is possible to obtain a SEM image in which secondary electrons emitted in a sample vertical direction are dominant among secondary electrons emitted from the sample 10. This condition is suitable for observation of a bottom of a deep hole or a deep groove, and a groove bottom pattern.

As mentioned above, a mechanism for each radiation angle valve can be implemented through a combination between the multistage electrostatic lenses 19 and the reflection plate 13, but a combination with the structures of the energy filter 22, the slit 23, and the energy spectroscope 24 described in Examples 2, 3 and 4 can be naturally realized.

Example 6

The multistage electrostatic lenses 19 are disposed on the same axis as that of the upper scanning deflector 5 and the lower scanning deflector 6, and thus preferably have a structure and arrangement of reducing the influence on the primary electron beam 3 as much as possible. FIG. 8 is a diagram illustrating a configuration of being capable of reducing the influence of the electrostatic lenses exerted on the primary electron beam 3. An electric field generated by the electrostatic lenses causes a deflection region on the sample 10 to be distorted. In a CD-SEM measuring a length of a pattern, if deflection distortion occurs, a measured length value changes, and thus it is very important to reduce deflection distortion.

In order to reduce the deflection distortion, electric fields on the primary electron beam 3 at an upper deflection fulcrum 26 and a lower deflection fulcrum 27 are required to be as small as possible. In order to realize such a situation, the upper deflection fulcrum 26 and the lower deflection fulcrum 27 are made to be the same as the height center of the electrostatic lens of the multistage electrostatic lenses 19 to which the ground potential is applied. With the above-described configuration, it is possible to reduce deflection distortion. In this example, a magnetic field type deflector is used as a scanning deflector.

As mentioned above, on the premise that electrodes to which a ground potential is applied are respectively provided in the upper scanning deflector 5 and the lower scanning deflector 6, it is necessary to dispose electrodes to which a voltage for forming a lens is applied so that the two electrodes are interposed therebetween. Therefore, preferably, electrodes in at least four stages (more preferably, in five stages since an electrode for suppressing divergence of electrons between the electrodes to which the ground potential is applied is preferably provided).

Example 7

In a case of electromagnetic scanning deflection using magnetic field action, an electrostatic lens is naturally formed of a nonmagnetic material, but, since a scanning deflector operates at a high speed, an eddy current caused by the electrostatic lens is required to be reduced. The eddy current also causes deflection distortion, and thus it is very important to prevent the eddy current in a CD-SEM. Regarding a structure of an electrostatic lens for preventing the eddy current, as illustrated in FIG. 9, it is effective that a cut 29 is provided in an electrostatic lens 28 (a tubular electrode), and thus a flow of an eddy current is cut.

Example 8

The multistage electrostatic lenses 19 may be applied to a scanning electron microscope mounted with an electrostatic scanning deflector as illustrated in FIG. 10. In order to reduce deflection distortion in the same manner as in the magnetic field scanning deflector, an upper deflection fulcrum 26 and a lower deflection fulcrum 27 which are fulcra of an upper electrostatic scanning deflector 30 and a lower electrostatic scanning deflector 31 are made to have the same height as the height center of an electrostatic lens to which a ground potential is applied.

In a case of an electrostatic deflector, the deflector functions as an electrostatic lens. The electrostatic deflector has a structure as illustrated in FIG. 11. Here, as an example, the electrostatic deflector having four electrodes is illustrated, but an electrostatic deflector having eight electrodes or twelve electrodes may be used. Here, the electrostatic deflector is formed of a +X electrode 32, −X electrode 33, a +Y electrode 34, and a −Y electrode 35, and electrostatic deflection voltages 59, 60, 61 and 62 are respectively applied thereto. The electrostatic deflection voltages 59 and 60, and the electrostatic deflection voltages 61 and 62 have inverted polarities and the same value.

In a case where the electrostatic deflector is operated as an electrostatic lens, an offset voltage 36 is applied to each electrode, and the deflection voltage is superposed thereon. According to the above-described configuration, the electrode of the electrostatic scanning deflector can be made to have action of an electrostatic lens, and can be made to function as both of an electrostatic lens and an electrostatic deflector. In the electrostatic scanning deflector which is disposed at the same height as a deflection fulcrum, the offset voltage 36 may be set to 0 V.

Example 9

Next, a description will be made of an Example of a scanning electron microscope other than the form in which the primary electron beam 3 is accelerated in the rear stage right before the sample 10 as illustrated in FIG. 1.

FIG. 12 illustrates a configuration of a scanning electron microscope in a form in which the primary electron beam 3 is accelerated by an all-stage acceleration cylinder 36 to which an all-stage acceleration voltage 64 is applied, through all stages from right after passing through the extraction electrode 2 to right before reaching the sample 10. Regarding advantages of the all-stage acceleration method, the primary electron beam 3 is applied at a high speed, and thus a resolution is good. In the rear-stage acceleration method illustrated in FIG. 1, there is a probability that aberration may occur due to the rear-stage acceleration cylinder 11 and lens action formed by a ground potential, but such aberration does not occur in the all-stage acceleration method. The front-stage acceleration cylinder 36 is connected to an acceleration electrode of the primary electron beam 3, or has a configuration in which an upper end thereof is located at a position (for example, directly under the acceleration electrode) where the primary electron beam 3 is further accelerated after being acceleration by the acceleration electrode, and a lower end thereof reaches an objective lens.

On the other hand, from the viewpoint of secondary electron trajectory control, a speed of a secondary electron is normally increased by the all-stage acceleration cylinder 36, and thus trajectory control is hardly performed. A voltage used for the orthogonal electromagnetic field deflector considerably increases, and thus the deflector cannot be basically used, and trajectories of secondary electrons cannot be controlled separately from a trajectory of the primary electron beam 3.

Therefore, in order to guide a secondary electron 37 on the optical axis to a detector 38, the primary electron beam 3 is separated from the axis by using a primary electron deflector 39 in four stages, and is returned to the optical axis after passing the detector 38. Since the primary electron beam 3 is returned to the optical axis, a secondary electron whose advancing direction is opposite to the primary electron beam 3 is deflected in an opposite direction to the primary electron beam 3, and is converted to have a trajectory of a secondary electron 39 which is then detected by the detector 38.

A secondary electron separated from the optical axis is detected by a detector 40 and a detector 41. A secondary electron at a low speed converges on the vicinity of the objective lens due to convergence action of the objective lens 8, and then diverges. Thus, a secondary electron at a relatively low speed is detected by the detector 40. On the other hand, a secondary electron at a high speed is fundamentally detected by the detector 41 since a convergence point thereof is separated from the objective lens.

As illustrated in FIG. 13, in an SEM using an all-stage acceleration method, in the same manner as in an SEM using the rear-stage acceleration method, secondary electron trajectories are defined depending on an optical condition for the primary electron beam 3, and thus secondary electrons reaching the detectors 38, 40 and 41 cannot be controlled separately. For example, there is no means for detecting a secondary electron 43 in the detector 38. In the all-stage acceleration SEM, it is hard to control a secondary electron trajectory separately from a primary electron beam trajectory by using the orthogonal electromagnetic field deflector. Therefore, there is a secondary electron which does not reach the detector 38 depending on an axis separation condition for the primary electron beam 3, such as a secondary electron 42. Naturally, there is also a secondary electron which collides with the column and is lost, such as a secondary electron 44.

In the present example, a description will be made of a charged particle beam device including a first lens (for example, the condenser lens 4; two or more first lenses may be provided) which focuses a charged particle beam; an objective lens which focuses a charged particle beam applied to a sample; a detector (for example, the detector 38) disposed between the objective lens and the first lens; a deflector (for example, a deflector at the lowermost end of the primary electron deflector 39) which deflects charged particles emitted from the sample so that the charged particles are more separated from an axis than the charged particle beam; and an acceleration cylinder which is formed to surround a passing trajectory of the charged particle beam reaching a passing opening of the charged particle beam in the objective lens from a passing opening of the charged particle beam in the first lens and to which a positive voltage is applied, in which the acceleration cylinder is divided in an optical axis direction of the charged particle beam. The acceleration cylinder mentioned here indicates multistage electrostatic lenses 45 which will be described later.

Even in the SEM using the all-stage acceleration method, in the same manner as in the SEM using the rear-stage acceleration method, it is possible to control a secondary electron trajectory by using the effect of the multistage electrostatic lenses. As illustrated in FIG. 14, at least a one-stage gap is provided in the all-stage acceleration cylinder, and the multistage electrostatic lenses 45 are formed by applying voltages thereto by using power sources (not illustrated) which are separately provided.

Secondary electrons such as secondary electrons 46 and 47 which originally collide with the column inner wall and are lost are respectively detected by detectors 40 and 41 due to convergence action of the multistage electrostatic lenses 45.

A secondary electron which is deflected toward the detector 38 due to magnetic field action of returning the primary electron beam 3 to the optical axis is deflected toward a location close to the optical axis as energy thereof becomes higher. The secondary electrons 48 and 49 reach the detector 38 while being subjected to the convergence action of the electrostatic lenses. On the other hand, unless there is the convergence action of the electrostatic lenses, the secondary electron 49 having low energy collides with the column inner wall and is lost, and thus only the secondary electron 48 having high energy is detected. A detected signal amount is increased due to the convergence action of the electrostatic lenses, and thus an image with high contrast can be observed.

Example 10

The SEM having the structure illustrated in FIG. 14 can be naturally combined with the structures of the energy filter 22, the slit 23, and the energy spectroscope 24 described in Examples 2, 3 and 4. In this case, the energy filter 22 and the slit 23 are disposed in the front stage of the detector 38, and the energy spectroscope 24 is disposed in the rear stage of the detector 38. The mechanism for each secondary electron radiation angle valve described in Example 5 can also be implemented by using the openings of the detectors 40 and 41, and the convergence action of the electrostatic lens.

Matching heights of the scanning deflector and the electrostatic lens, described in Example 6, or preventing an eddy current by providing a cut in the electrostatic lens, described in Example 7, is the same as in the rear-stage acceleration type SEM illustrated in FIG. 1. A configuration of the electrostatic deflector described in Example 8 can naturally employ the configuration of the rear-stage acceleration type SEM.

Example 11

In the present example, a description will be made of an example in which desired measurement or inspection is performed by appropriately adjusting electrostatic lenses in a plurality of stages. FIG. 15 is a diagram illustrating an example of a measurement/inspection system including an SEM 1501.

The present system includes a scanning electron microscope system formed of an SEM 1501, a control device 1502 of the SEM, and a calculation processing device 1503. The calculation processing device 1503 includes a calculation processing unit 1507 which supplies predetermined control signals to the control device 1502 and performs signal processing on a signal obtained from the SEM main body 1301, and a memory 1506 which stores obtained image information or recipe information. In the present example, a description will be made assuming that the control device 1502 is separated from the calculation processing device 1507, but an integrated control device may be used.

An electron emitted from a sample or an electron generated at a conversion electrode is captured by a detector 1213, and is converted into a digital signal by an A/D converter built into the control device 1502. Image processing is performed depending on a purpose by image processing hardware such as a CPU, an ASIC, and an FPGA built into the calculation processing device 1507.

The calculation processing device 1507 includes an optical condition setting portion 1508 which sets optical conditions for the SEM on the basis of measurement conditions which are input by using an input device 1504, an image quality evaluation portion 1509 which evaluates image quality of the entire image or a set region of interest (ROI) as will be described later, and a pattern measurement portion 1510 which measures a dimension of a pattern on the basis of an acquired signal waveform. The pattern measurement portion 1510 forms a line profile on the basis of, for example, a detected signal, and measures a dimension between peaks of the profile.

A beam irradiation position or a scanning position is changed by controlling a drive signal for the sample stage or a signal supplied to an image shift deflector.

A GUI which displays an image or an inspection result to an operator is displayed on a display device provided in the input device 1504 which is connected to the calculation processing device 1508 via a network.

Some or all of control or processes in the calculation processing device 1507 may be assigned to an electronic computer or the like mounted with a CPU and a memory which can accumulate images so as to be processed and controlled. As described above, the control device 1502 and the calculation processing device 1503 may be configured as a single calculation device. The input device 1504 functions as an imaging recipe creating device which sets measurement conditions including coordinates of an electronic device, the type of pattern, and imaging conditions (an optical condition or a stage movement condition) required for inspection, as imaging recipes. The input device 1310 also has a function of checking input coordinate information or information regarding the type of pattern with layer information of design data or pattern identification information, and reading necessary information from a design data storage medium (not illustrated).

First, in the present example, a description will be made of an example in which lens conditions for the multistage electrostatic lenses 19 are stored in the memory 1506 in advance, and the stored lens conditions (for example, a voltage to be applied to an electrode) are read on the basis of measurement and inspection conditions which are input from the input device 1504. FIG. 16 is a diagram illustrating an example of a table storing an appropriate lens condition for each combination between a radiation angle of a secondary electron and energy of the secondary electron. Of course, a table indicating a relationship between either a radiation angle or energy and a lens condition may be used. Such tables may be created in advance on the basis of, for example, trajectory simulation of secondary electrons, and may be selected via the input device 1504 depending on a measurement purpose so as to be read. For example, a condition in which detection efficiency of an electron with a desired radiation angle and energy is highest may be set as the stored lens conditions.

A trajectory or energy of a secondary electron changes depending on a material forming a sample, a pattern shape, optical conditions for an electron microscope, and thus tables are preferably created for combinations between such conditions.

The memory 1506 may store a table storing a measurement part and a lens condition in correlation with each other so that a lens condition can be selected not depending on a radiation angle or energy but depending on a selected measurement target.

Example 12

Next, a description will be made of a method of finding an appropriate lens condition. FIG. 17 is a diagram illustrating an example of a graphical user interface (GUI) which is displayed on the display device of the input device 1504, and FIG. 18 is a flowchart illustrating a process for finding an appropriate lens condition. A GUI screen 1701 is provided with a setting window (Location) for setting a position where a SEM image is acquired, a setting window (Pattern Type) for setting the type of pattern, a setting window (Vacc) for setting an acceleration voltage of a primary electron beam, a window (Number of Frames) for setting an accumulated number of frames when an image is formed, a setting window for setting a scanning range (field of view (FOV)) of an electron microscope, and a setting window (Probe Current) for setting a beam current of a primary electron beam.

The GUI screen 1701 is provided with a setting window (secondary electron (SE) Lens Condition) for setting a lens condition for the electrostatic lenses 19, and setting windows (ROI 1 and ROI 2) for setting coordinates of ROIs. As the ROI setting window, a window for setting not only coordinates of an ROI but also a size thereof may be provided. A position or a size of an ROI may be set by using a pointing device or the like.

The GUI screen 1701 is provided with a SEM image display region 1702, and a graph display region 1708 displaying a relationship between a lens condition (SE Lens Condition) for the electrostatic lenses and brightness (Brightness) in an ROI. A longitudinal axis of a graph in the graph display region 1708 may express not the brightness but a luminance difference between the brightest pixel and the darkest pixel in an ROI. In the present example, a description will be made of a case where the longitudinal axis expresses a luminance difference.

Hereinafter, with reference to a flowchart illustrated in FIG. 18, a description will be made of a process in which an appropriate lens condition for the electrostatic lenses is found on the basis of conditions set on the GUI screen 1701.

First, a sample (wafer) is introduced into a vacuum sample chamber of the SEM, and a SEM image is acquired on the basis of conditions set on the GUI screen 1701 (steps S1801 and 1802). The SEM image is displayed in the SEM image display region 1702. A hole pattern 1703 is displayed in the SEM image displayed in the SEM image display region 1702, and an edge 1704 of an intermediate layer located under a hole surface, and an edge 1705 of a bottom layer of the hole are displayed. Next, an ROI is set on the SEM screen (step S1803). In the example illustrated in FIG. 17, ROIs 1706 and 1707 are respectively set for the edge 1704 of the intermediate layer and the edge 1705 of the bottom layer.

The electrostatic lenses are set to predetermined conditions in a state in which the ROIs are set as mentioned above, and an image is acquired under the set conditions (steps S1804 and 1805). In this case, image quality ratio evaluation in the ROIs is performed (step S1806), and processes in steps S1804 to 1806 are repeatedly performed until image quality in the ROIs are brought into a predetermined state, or setting of a predetermined number of conditions is completed. The predetermined state mentioned here indicates a state in which, for example, a luminance difference between a bright pixel and a dark pixel in the ROI is equal to or more than a predetermined value. If a luminance difference between a bright portion and a dark portion is large, this indicates a state in which an edge as a measurement reference is clear. Thus, for example, a luminance profile is formed, and a lens condition is set so that a difference between a bottom and a peak of the luminance profile is equal to or more than a predetermined value. A predetermined number of lens conditions may be set, and a lens condition in which the luminance difference is largest may be set.

In the present example, two ROIs 1706 and 1707 are set, but, for example, if a measurement purpose is to measure a diameter of the bottom of the hole pattern, a lens condition A of the graph displayed in the graph display region 1708 is preferably selected. On the other hand, if a measurement purpose is to measure a diameter of the intermediate layer of the hole pattern, a lens condition B is preferably selected. In a case where both of the bottom layer and the intermediate layer are measurement targets, a lens condition C in which luminance values of both thereof are not the maximum but are high is preferably selected. In a case where a plurality of ROIs are measurement targets, the greatest value may be selected from among values adding and averaging luminance values of the respective ROIs in order to find an optimum lens condition. A lens condition may be set on the basis of a weight in which importance of measurement is taken into consideration, and a lower limit value (threshold value) of a luminance difference may be set in advance, and a lens condition in which an addition average value of luminance differences is the greatest may be selected from among lens conditions in which luminance differences of a plurality of ROIs are more than the threshold value.

As exemplified in FIG. 17, a graph indicating a relationship between a change in information regarding luminance of a plurality of ROIs and a change in a lens condition, or a table indicating the change relationship is displayed on the display device, and thus it is possible to appropriately select a lens condition according to a measurement purpose.

Example 13

Next, a description will be made of another method for finding an appropriate lens condition. FIG. 19 is a diagram illustrating an example of an image in a case where electrons are detected by the upper detector 18, and the image is formed on the basis of the electron, for respective intensities in the multistage lenses. If a size of a field of view (a size of a scanning region formed by the upper scanning deflector 5 and the lower scanning deflector 6) is made sufficiently large (with low magnification), and scanning is performed with a beam, images formed on the basis of electrons detected by the upper detector 18 are as in FIG. 19. A circular pattern exemplified in FIG. 19 is a projection image of the opening of the reflection plate 13, and the image is obtained so that the circle inside is bright, and the circle outside is dark since the image is formed on the basis of electrons having passed through the opening.

In the present example, a description will be made of a method of finding an appropriate lens condition with reference to such an image. In the present example, among images exemplified in FIG. 19, (c) is an image formed under conditions including an appropriately set lens condition. In the image of (c), a contour of the opening of the reflection plate 13 is clear, but, in the other figures, contours of the opening are formed in plurality in a blurred manner. If electrons emitted from a sample converge due to the multistage lenses, and are thus focused on the reflection plate 13, the image as illustrated in FIG. 19(c) is formed. If the electrons are focused on the reflection plate 13, the electrons emitted from the sample are narrowed most at the position of the reflection plate 13, and the number of electrons passing through the opening is the maximum. FIG. 20 is a flowchart illustrating a process for finding such a lens condition.

First, a sample (wafer) is introduced into a vacuum sample chamber of the SEM, and a SEM image is acquired (steps S2001 and 2002). The SEM image is displayed in the SEM image display region 1702. A projection image of the opening of the reflection plate 13 is displayed in the SEM image displayed in the SEM image display region 1702. An image is formed under each of a plurality of lens conditions with the lens condition for the multistage lenses as an initial condition (steps S2003 and 2004). An image formed in the above-described way is evaluated, and an appropriate lens condition is selected (steps S2005 and 2006).

In a case where image evaluation is performed, for example, a luminance change under each lens condition is monitored by plotting a change in luminance relative to a pixel position with respect to a luminance evaluation portion 1901 exemplified in FIG. 19. In the example illustrated in FIG. 21, an applied voltage C causes a rapid change in luminance at an edge portion, and thus it can be seen that contrast of the edge portion of the opening of the reflection plate 13 is high. Therefore, an applied voltage which causes a width of a slope part in the edge portion to be the minimum, or the slope part to be tilted most is selected, and thus a detection amount of electrons emitted from the sample can be made the maximum.

According to the SEM which automatically performs the above-described control, it is possible to easily find an appropriate lens condition. In order to maximize an amount of electrons having specific energy, image evaluation as described above may be performed on the basis of detection of electrons obtained by using, for example, an energy filter or an energy analyzer, and a lens condition may be selected on the basis of the image evaluation.

In the present example, a projection image of the opening of the reflection plate 13 is an evaluation target, but, instead of the reflection plate 13, other structural bodies (for example, a direct detector such as a micro channel plate (MCP), or members provided in the SEM other than the detector) having passing openings of a primary electron beam may be evaluation targets. In a case where a lens condition in which output from the upper detector 18 is the maximum is a condition in which output from the lower detector 15 is the minimum, a lens condition may be controlled on the basis of the output from the lower detector.

REFERENCE SIGNS LIST

1 ELECTRIC FIELD RADIATION CATHODE
2 EXTRACTION ELECTRODE
3 PRIMARY ELECTRON BEAM
4 CONDENSER LENS
5 UPPER SCANNING DEFLECTOR
6 LOWER SCANNING DEFLECTOR
7 OBJECTIVE APERTURE
8 OBJECTIVE LENS
9 HOLDER
10 SAMPLE
11 ACCELERATION CYLINDER
12 SECONDARY ELECTRON
13 REFLECTION PLATE
14 TERTIARY ELECTRON
15 LOWER DETECTOR
16 ORTHOGONAL ELECTROMAGNETIC FIELD DEFLECTOR
17 DEFLECTED SECONDARY ELECTRON
18 UPPER DETECTOR
19 MULTISTAGE ELECTROSTATIC LENSES
20 SECONDARY ELECTRON
21 SECONDARY ELECTRON
22 ENERGY FILTER
23 SLIT
24 ENERGY SPECTROSCOPE
25 EMISSION SLIT
26 UPPER DEFLECTION FULCRUM
27 LOWER DEFLECTION FULCRUM
28 ELECTROSTATIC LENS
29 ELECTROSTATIC LENS NOTCH
30 UPPER ELECTROSTATIC SCANNING DEFLECTOR
31 LOWER ELECTROSTATIC SCANNING DEFLECTOR
32 +X ELECTRODE
33 -X ELECTRODE
34 +Y ELECTRODE
35 -Y ELECTRODE
36 ALL-STAGE ACCELERATION CYLINDER
37 SECONDARY ELECTRON
38 DETECTOR
39 PRIMARY ELECTRON DEFLECTOR
40 DETECTOR
41 DETECTOR
42 SECONDARY ELECTRON
43 SECONDARY ELECTRON
44 SECONDARY ELECTRON
45 MULTISTAGE ACCELERATION CYLINDER
46 SECONDARY ELECTRON
47 SECONDARY ELECTRON
48 SECONDARY ELECTRON
49 SECONDARY ELECTRON
51 CATHODE VOLTAGE
52 EXTRACTION VOLTAGE
53 DECELERATION VOLTAGE
54 ACCELERATION CYLINDER VOLTAGE
55 MULTISTAGE ELECTROSTATIC LENS VOLTAGE
56 ENERGY FILTER VOLTAGE
57 INNER SECTOR VOLTAGE
58 OUTER SECTOR VOLTAGE
59 +X ELECTRODE VOLTAGE
60 -X ELECTRODE VOLTAGE

61 +Y ELECTRODE VOLTAGE
62 −Y ELECTRODE VOLTAGE
63 ELECTROSTATIC DEFLECTION OFFSET VOLTAGE
64 ALL-STAGE ACCELERATION CYLINDER VOLTAGE
101 SCANNING ELECTRON MICROSCOPE

The invention claimed is:

1. A charged particle beam device comprising:
an objective lens that focuses a charged particle beam emitted from a charged particle source;
a detector that is disposed between the objective lens and the charged particle source;
a deflector that deflects charged particles emitted from a sample so that the charged particles are more separated from an axis than the charged particle beam; and
a plurality of electrodes that are disposed between the deflector and the objective lens, and form a plurality of electrostatic lenses focusing the charged particles emitted from the sample toward a deflection point of the deflector;
wherein, in the plurality of electrodes, electrodes to which different voltages are applied are alternately disposed.

2. The charged particle beam device according to claim 1, wherein, in the plurality of electrodes, an electrode to which a negative voltage is applied and an electrode to which a ground potential is applied are alternately disposed.

3. The charged particle beam device according to claim 1, further comprising:
an energy filter that energy-separates the charged particles deflected by the deflector.

4. The charged particle beam device according to claim 1, further comprising:
a slit through which a charged particle deflected in a specific direction selectively passes among the charged particles deflected by the deflector.

5. The charged particle beam device according to claim 1, further comprising:
an energy spectroscope that performs energy spectral analysis on the charged particles deflected by the deflector.

6. The charged particle beam device according to claim 1, wherein, in the plurality of electrodes, an electrode to which a positive voltage is applied and an electrode to which a ground potential is applied are alternately disposed.

7. The charged particle beam device according to claim 6, further comprising:
a passing opening-formed member that has a passing opening of the charged particle beam and is provided between the deflection point and the plurality of electrodes.

8. The charged particle beam device according to claim 7, wherein a positive voltage is applied to an electrode closest to the passing opening-formed member among the plurality of electrodes.

9. The charged particle beam device according to claim 1, further comprising:
a deflector in two stages that scans the sample with the charged particle beam,
wherein the deflector in two stages has the same height as a height of an electrode to which a ground potential is applied among the plurality of electrodes.

10. The charged particle beam device according to claim 9,
wherein the scanning deflector is a magnetic field type deflector or an electrostatic type deflector.

11. The charged particle beam device according to claim 1,
wherein each of the electrodes has a tubular shape, and partially has a cut.

12. The charged particle beam device according to claim 1,
wherein the electrodes forming the plurality of electrostatic lenses include at least four electrodes.

13. The charged particle beam device according to claim 12,
wherein, among the four electrodes, a ground potential is applied to two electrodes, and two electrodes to which a voltage is applied are disposed so that the electrodes to which the ground potential is applied are interposed therebetween.

14. The charged particle beam device according to claim 13, further comprising:
a scanning deflector formed of upper and lower deflectors in two stages for scanning with the charged particle beam,
wherein the electrodes to which the ground potential is applied are respectively disposed at the same height positions as height positions of the deflectors in two stages.

15. The charged particle beam device according to claim 13,
wherein an electrode to which a voltage is applied is disposed between the two electrodes to which the ground potential is applied.

16. The charged particle beam device according to claim 1, further comprising:
a calculation device that obtains a lens condition for the plurality of electrostatic lenses on the basis of a detection signal detected by the detector,
wherein the calculation device evaluates a projection image of a structural body present in the charged particle beam device, and selects the lens condition in which the projection image satisfies a predetermined condition.

17. A charged particle beam device comprising:
an objective lens that focuses a charged particle beam emitted from a charged particle source;
a detector that is disposed between the objective lens and the charged particle source;
a deflector that deflects charged particles emitted from the sample so that the charged particles are more separated from an axis than the charged particle beam;
an energy spectroscope that performs energy spectral analysis on the charged particles deflected by the deflector; and
a negative voltage applying source that applies a negative voltage to the energy spectroscope and the sample or a sample stage mounted with the sample,
wherein the energy spectroscope includes an inner electrode and an outer electrode which separate trajectories of charged particles deflected by the deflector, by using an electric field formed between the electrodes,
wherein the charged particle beam device further includes a power source for the energy spectroscope that applies a positive voltage and a negative voltage to the inner electrode and the outer electrode, respectively, and
wherein the power source for the energy spectroscope is floated by the negative voltage applying source.

18. The charged particle beam device according to claim 17,
wherein at least two electrodes are disposed between a deflection fulcrum of the deflector and the energy spectroscope, a positive voltage is applied to an electrode located on the deflection fulcrum side of the two electrodes, and a negative voltage applied from the negative voltage applying source and a positive voltage are applied to an electrode located on the energy spectroscope side of the two electrodes in a superposed manner.

19. A charged particle beam device comprising:
a first lens that focuses a charged particle beam emitted from a charged particle source;
an objective lens that focuses a charged particle beam applied to a sample;
a detector that is disposed between the objective lens and the first lens;
a deflector that deflects charged particles emitted from the sample so that the charged particles are more separated from an axis than the charged particle beam; and
an acceleration cylinder that is formed to surround a passing trajectory of the charged particle beam reaching a passing opening of the charged particle beam in the objective lens from a passing opening of the charged particle beam in the first lens, and to which a positive voltage is applied,
wherein the acceleration cylinder is divided to form a plurality of electrostatic lenses between the deflector and the sample.

* * * * *